(12) United States Patent
Bernstein et al.

(10) Patent No.: US 8,729,549 B2
(45) Date of Patent: May 20, 2014

(54) TEST STRUCTURE AND METHODOLOGY FOR THREE-DIMENSIONAL SEMICONDUCTOR STRUCTURES

(75) Inventors: Kerry Bernstein, Underhill, VT (US); Jerome L. Cann, Jericho, VT (US); Christopher M. Durham, Round Rock, TX (US); Paul D. Kartschoke, Williston, VT (US); Peter J. Klim, Austin, TX (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/533,191

(22) Filed: Jun. 26, 2012

(65) Prior Publication Data

US 2012/0262197 A1   Oct. 18, 2012

Related U.S. Application Data

(63) Continuation of application No. 11/935,724, filed on Nov. 6, 2007, now Pat. No. 8,294,149.

(51) Int. Cl.
*H01L 23/58* (2006.01)

(52) U.S. Cl.
USPC .................. 257/48; 257/E21.531; 438/18

(58) Field of Classification Search
USPC ........ 257/48, 774, E23.002, E21.531; 438/18
See application file for complete search history.

(56) References Cited

U.S. PATENT DOCUMENTS

| | | | |
|---|---|---|---|
| 6,429,509 B1 | 8/2002 | Hsuan | |
| 6,744,127 B2 * | 6/2004 | Hedler et al. | 257/686 |
| 2004/0004216 A1 | 1/2004 | Eldridge et al. | |
| 2004/0128599 A1 | 7/2004 | Rajski et al. | |
| 2005/0046002 A1 | 3/2005 | Lee et al. | |
| 2006/0227587 A1 * | 10/2006 | Nakamura et al. | 365/63 |

OTHER PUBLICATIONS

Office Action, dated Jun. 27, 2013, received in a related U.S. Patent Application, namely U.S. Appl. No. 13/533,188.

* cited by examiner

*Primary Examiner* — Shaun Campbell
(74) *Attorney, Agent, or Firm* — Scully, Scott, Murphy & Presser, P.C.; Vazken Alexanian

(57) ABSTRACT

A plurality of peripheral test structure substrate (PTSS) through vias is formed within a peripheral test structure substrate. A peripheral test structure layer and at least one functional layer are formed on one side of the plurality of the PTSS through vias. The other side of the plurality of the PTSS through vias is exposed throughout fabrication of the peripheral test structure layer and the at least one functional layer to provide access points for testing functionality of the various layers throughout the manufacturing sequence. C4 bonding may be performed after manufacture of all of the at least one functional layer is completed. A 3D assembly carrier or a C4 carrier substrate is not required since the peripheral test structure substrate has sufficient mechanical strength to support the peripheral test structure layer and the at least one functional layer.

15 Claims, 46 Drawing Sheets

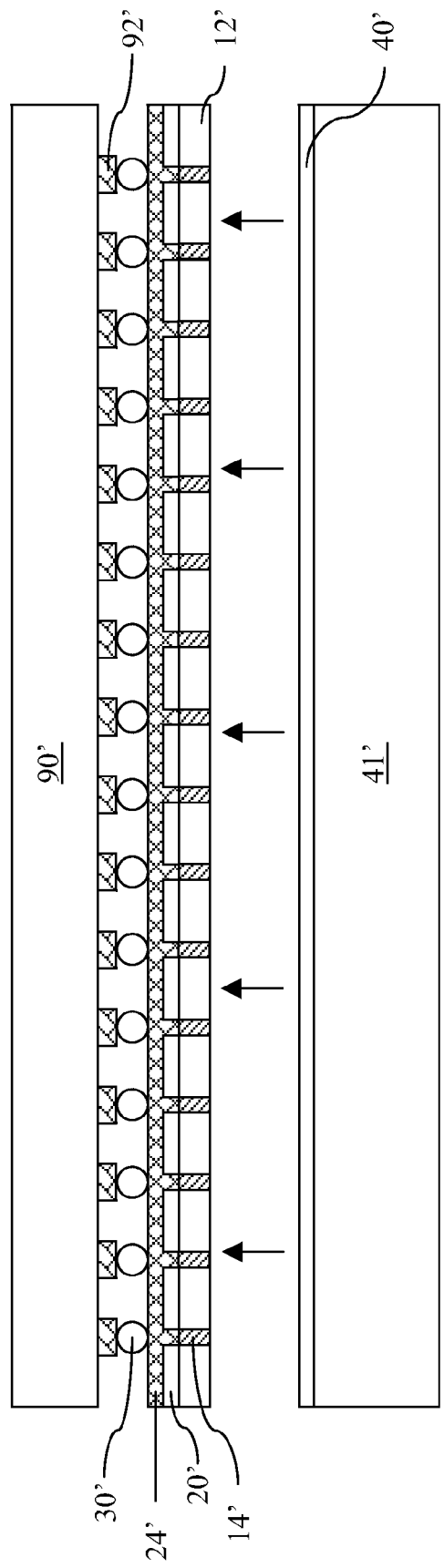
FIG. 1J    (Prior Art)

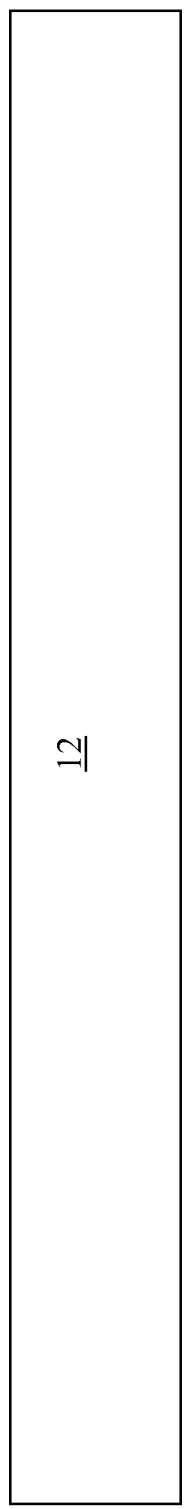

TEST STRUCTURE AND METHODOLOGY FOR THREE-DIMENSIONAL SEMICONDUCTOR STRUCTURES

CROSS REFERENCE TO RELATED APPLICATION

This application is a continuation of U.S. patent application Ser. No. 11/935,724, filed Nov. 6, 2007 the entire content and disclosure of which is incorporated herein by reference.

FIELD OF THE INVENTION

The present invention generally relates to structures and methodology for testing three-dimensional semiconductor structures having multiple functional layers.

BACKGROUND OF THE INVENTION

Test structures are typically allocated little space in a single layer semiconductor design, physical space being at a premium. Consequently, incorporation of a large test structure or a test structure integrally formed with and located near a functional semiconductor circuit into the single layer semiconductor design are economically prohibitive.

Three dimensional semiconductor structures address such needs by providing an integrally formed test structures located in a peripheral testing layer that is formed above or below a functional layer containing a semiconductor circuit. Formation of the peripheral testing layer adds another dimension, i.e., a third dimension or a "z-dimension," to the two dimensional semiconductor structures within the functional layer. Further, additional functional layers may be formed on the functional layer. Thus, the peripheral testing layer may incorporate large test structures and test structures located near and integrally formed with the functional layers in the semiconductor structure. Thus, three-dimensional test structures enable incorporation of large test structures within the semiconductor structure.

Further, in a typical single layer semiconductor structure, the number of input/output pins is significantly less than the number of circuits, typically be several orders of magnitude, since test structures and related input/output pins cannot occupy a large spacer. Thus, test patterns, i.e., patterns of 0's and 1's employed to test functionality of a semiconductor circuit such as an array structure or a scan chain, are introduced into and scanned across a semiconductor circuit. Scanning of the test patterns across the semiconductor circuit typically requires at least as many clock cycles as the number of gates per scan chain, and takes a significant amount of test time. A three-dimensional test structure may reduce the test time since the number of input/output pins as well as the contests of test circuitry of the three-dimensional test structure is much more than what is typically included in single layer semiconductor structures, oftentimes providing almost one-to-one ratio between functional devices in functional layers and test devices within the peripheral testing layer.

The peripheral testing layer is typically formed in close proximity to the semiconductor circuits to be tested. Various test circuits, system verification circuits, and diagnostic circuits may be placed within the peripheral testing layer. The circuits within the peripheral testing layer may be designed with relaxed design ground rules, i.e., design ground rules employing dimensions greater than lithographic critical dimensions, to insure that the yield of the three-dimensional semiconductor structure is not limited by the yield of the peripheral layer.

FIGS. 1A-1U show sequential vertical cross-sectional views of an exemplary prior art three-dimensional semiconductor structure during manufacturing and testing. Referring to FIG. 1A, the exemplary prior art three-dimensional semiconductor structure comprises a peripheral test structure substrate (PTSS) 10' in which a plurality of peripheral test structure substrate (PTSS) via holes 13' are formed, for example, by lithographic patterning and etching. The PTSS 10' may comprise a semiconductor or an insulator.

Referring to FIG. 1B, the plurality of PTSS via holes 13' are filled with a conductive material, such as a metal, and planarized to form a plurality of peripheral test structure substrate (PTSS) vias 14'.

Referring to FIG. 1C, a peripheral test structure layer (PTSL) 20' is formed on the side of the PTSS 10' that contains the plurality of the PTSS vias 14'. The PTSL 20' contains various test circuits described above. The upper surface of the PTSL 20' may, or may not, contain metal contacts, metal lines, metal vias, or other metal interconnect structures that provide electrical connections to the circuits in the PTSL 20'. The regions of the PTSL 20' directly above each of the plurality of the PTSS vias 14' are typically reserved for subsequently making electrical contacts to the plurality of the PTSS vias 14' as described below.

Referring to FIG. 1D, the PTSL 20' is patterned to expose top surfaces of the plurality of the PTSS vias 14'. Lithographic methods and an etch may be employed to effect this processing step.

Referring to FIG. 1E, a peripheral test structure interconnect layer (PTSIL) 24' is formed on the PTSL 20' and on the exposed surfaces of the plurality of the PTSS vias 14'. The PTSIL 24' contains metal interconnect structures that provide electrical connection to the various test circuits in the PTSL 20' and to the plurality of the PTSS vias 14'. Further, the PTSIL 24' contains peripheral test structure interconnect layer (PTSIL) Controlled Collapse Chip Connection (C4) pads (not shown separately).

Referring to FIG. 1F, C4 balls 30' are formed on the PTSIL C4 pads within the PTSIL 24'.

Referring to FIG. 1G, the exemplary prior art semiconductor structure containing the PTSS 10', the plurality of the PTSS vias 14', the PTSL 20', the PTSIL 24', and the C4 balls 30' is loaded onto a substrate test station (not shown) that is connected to a tester (not shown). A first test probe 80' to which a first set of test pins 81' is attached is also loaded into the substrate test station. The first set of test pins 81' contacts the C4 balls 30' of the exemplary prior art semiconductor structure, and subsequently, testing is performed to ascertain the functionality of the PTSL 20' within each semiconductor die. While the yield of the exemplary prior art semiconductor structure is typically high at this point since the PTSL 20' typically employs relaxed ground rule structures, any defective dies are recorded into a test data tracking system so that the defective dies may be excluded from future testing and eventually discarded.

Referring to FIG. 1H, the exemplary prior art semiconductor structure is unloaded from the substrate test station. A first C4 carrier substrate 90' containing first carrier C4 pads 92' is placed over the C4 balls 30' and C4 bonding is performed as well known in the art. After the C4 bonding, the first C4 carrier substrate 90' and the PTSS 10' are structurally connected by the C4 balls 30' that are bonded to both the PTSIL C4 pads and the first carrier C4 pads 92'.

Referring to FIG. 1I, backside grinding (BSG) processing step is performed to remove a bottom portion of the PTSS 10' until bottom surfaces of the plurality of the PTSS vias 14' are exposed. The remaining portion of the PTSS 10' constitutes a thinned peripheral test structure substrate (TPTSS) 12'.

Referring to FIG. 1J, a first functional layer carrier 41' having a first functional layer 40' is brought into contact with the bottom surface of the TPTSS 12', and aligned to the exposed bottom surfaces of the plurality of the PTSS vias 14'. The first functional layer 40' comprises a first set of functional semiconductor circuits such as a processor core, various levels of cache memory, embedded memory, or other known semiconductor circuits. Preferably, the first functional layer 40' contains little or no test circuits since test circuits are primarily formed in the PTSL 20'.

Referring to FIG. 1K, the first functional layer 40' is bonded to the bottom surface of the TPTSS 12' by methods known in the art. Thereafter, the first functional layer carrier 41' is removed. Methods such as separation by a hydrogen implanted layer, or any other method known in the art for separating a carrier substrate may be employed to separate the first functional layer carrier 41' from the first functional layer 40'.

Referring to FIG. 1L, the first functional layer 40' is patterned to expose the bottom surfaces of the plurality of the PTSS vias 14'.

Referring to FIG. 1M, a first functional interconnect layer 44' is formed on the first functional layer 40' and on the exposed bottom surfaces of the plurality of the PTSS vias 14'. The first functional interconnect layer 44' contains metal interconnect structures that provide electrical connection to the first set of functional semiconductor circuits in the first functional interconnect layer 40' and to the plurality of the PTSS vias 14'.

Referring to FIG. 1N, a first 3D assembly carrier 70' is bonded to the first functional interconnect layer 44'. Bonding methods known in the art may be employed. The first 3D assembly carrier 70' provides mechanical support to the three-dimensional assembly that it carries.

Referring to FIG. 1O, the first C4 carrier substrate 90' containing the first carrier C4 pads 92' are separated from the C4 balls 30'. The bonding between the C4 balls 30' and the first carrier C4 pads 92' may be weakened by elevating the temperature of the C4 balls 30' prior to separation to minimize structural damage to the C4 balls 30' due to the separation.

The exemplary prior art semiconductor structure containing the TPTSS 12', the plurality of the PTSS vias 14', the PTSL 20', the PTSIL 24', the C4 balls 30', the first functional layer 40', the first functional interconnect layer 44', and the first 3D assembly carrier 70' is loaded onto a substrate test station (not shown) that is connected to a tester (not shown). A second test probe 82' to which a second set of test pins 83' is attached is also loaded into the substrate test station. The second set of test pins 83' contacts the C4 balls 30' of the exemplary prior art semiconductor structure, and subsequently, testing is performed to ascertain the functionality of the first functional layer 40' within each semiconductor die. Any defective dies are recorded into the test data tracking system so that defective dies may be excluded from future testing and eventually discarded. The second test probe 82' may, or may not, be the same as the first test probe 80'.

Referring to FIG. 1P, the exemplary prior art semiconductor structure is unloaded from the substrate test station. A second C4 carrier substrate 94' containing second carrier C4 pads 96' is placed over the C4 balls 30' and C4 bonding is performed as well known in the art. After the C4 bonding, the second C4 carrier substrate 94' and the TPTSS 12' are structurally connected by the C4 balls 30' that are bonded to both the PTSIL C4 pads and the second carrier C4 pads 96'.

Referring to FIG. 1Q, the 3D assembly carrier 70' is separated from the first functional interconnect layer 44' employing one of the methods of separating a layer from another layer that are known in the art.

Referring to FIG. 1R, a second functional layer carrier 51' having a second functional layer 50' is brought into contact with, and aligned to structural features of, the bottom surface of the first functional interconnect layer 44'. The second functional layer 50' comprises a second set of functional semiconductor circuits, which may contain similar semiconductor components as the first functional layer 40'. Preferably, the second functional layer 50' contains little or no test circuits since test circuits are primarily formed in the PTSL 20'.

The second functional layer 50' is bonded to the bottom surface of the first functional interconnect layer 44' by methods known in the art. Thereafter, the second functional layer carrier 51' is removed. Methods known in the art for separating a carrier substrate may be employed.

Referring to FIG. 1S, processing steps similar to the processing steps of FIGS. 1L and 1M are performed thereafter to pattern the second functional layer 50', to expose portions of the first functional interconnect layer 44', to form a second functional layer 54' on the second functional layer 50' and on the exposed portions of the first functional interconnect layer 44'. The second functional interconnect layer 44' contains metal interconnect structures that provide electrical connection to the second set of functional semiconductor circuits in the second functional interconnect layer 50' and to the circuit elements in the exposed portions of the first functional interconnect layer 44'.

Referring to FIG. 1T, a second 3D assembly carrier 72' is bonded to the second functional interconnect layer 54'. Bonding methods known in the art may be employed. The second 3D assembly carrier 72' provides mechanical support to the three-dimensional assembly that it carries.

Referring to FIG. 1U, the second C4 carrier substrate 94' containing the second carrier C4 pads 96' are separated from the C4 balls 30'. The bonding between the C4 balls 30' and the second carrier C4 pads 96' may be weakened by elevating the temperature of the C4 balls 30' prior to separation to minimize structural damage to the C4 balls 30' due to the separation.

The exemplary prior art semiconductor structure containing the TPTSS 12', the plurality of the PTSS vias 14', the PTSL 20', the PTSIL 24', the C4 balls 30', the first functional layer 40', the first functional interconnect layer 44', the second functional layer 50', the second functional interconnect layer 54', and the second 3D assembly carrier 72' is loaded onto the substrate test station (not shown) that is connected to a tester (not shown). A third test probe 84' to which a third set of test pins 85' is attached is also loaded into the substrate test station. The third set of test pins 85' contacts the C4 balls 30' of the exemplary prior art semiconductor structure, and subsequently, testing is performed to ascertain the functionality of the second functional layer 50' within each semiconductor die. Any defective dies are recorded into the test data tracking system so that defective dies may be excluded from future testing and eventually discarded. The third test probe 84' may, or may not, be the same as one of the first test probe 80' and the second test probe 82'.

Processing steps equivalent to FIGS. 1P-1U are repeated performed to build additional functional layers and additional functional interconnect layers on the exemplary prior art semiconductor structure. For attachment of each set of an additional functional layer and an additional functional interconnect layer onto the preexisting portions of the exemplary prior art semiconductor structure and accompanying testing, a set of a functional layer carrier, a 3D assembly carrier, and a C4 carrier substrate are successively bonded and separated. Each of the bonding steps and separation steps involve processing steps that consumes processing time as well as introducing factors that degrade yield of the exemplary prior art semiconductor structure. Further, in the case of the repeated boding and separation of the C4 carrier substrates, the same C4 balls 30' are employed in each round of the bonding and separation, which tends to degrade yield of the later bonding processes.

In view of the above, there exists a need for simplified and more economical three-dimensional semiconductor structures that are amenable to a high-yield manufacturing sequence.

Specifically, there exists a need for three-dimensional semiconductor structures on which testing of functional layers may be performed without repeated attachment and detachment of 3D assembly carriers and/or C4 carrier substrates, and methods of manufacturing the same.

SUMMARY OF THE INVENTION

The present invention addresses the needs described above by providing a three-dimensional semiconductor structure that allows testing of a peripheral test structure layer and individual functional layers without requiring use of a 3D assembly carrier or a C4 carrier substrate.

In the present invention, a plurality of peripheral test structure substrate (PTSS) through vias is formed within a peripheral test structure substrate. A peripheral test structure layer and at least one functional layer are formed on one side of the plurality of the PTSS through vias. The other side of the plurality of the PTSS through vias is exposed throughout fabrication of the peripheral test structure layer and the at least one functional layer to provide access points for testing functionality of the various layers throughout the manufacturing sequence. C4 bonding may be performed after manufacture of all of the at least one functional layer is completed. A 3D assembly carrier or a C4 carrier substrate is not required since the peripheral test structure substrate has sufficient mechanical strength to support the peripheral test structure layer and the at least one functional layer.

According to an aspect of the present invention, a semiconductor structure is provided, which comprises:

a plurality of conductive through vias located in a substrate;

a peripheral test structure layer located abutting the substrate and containing peripheral test structures; and at least one functional layer abutting the peripheral test structure layer and containing at least one functional semiconductor circuit, wherein top surfaces of the plurality of the conductive through vias are exposed on an opposite side of the substrate relative to the peripheral test structure layer and provide access points for testing the peripheral test structures and the at last one functional semiconductor circuit.

In one embodiment, the top surfaces of the plurality of the conductive through vias are coplanar with a top surface of the substrate.

In another embodiment, a set of test pins of a test probe directly contacts the top surfaces of the plurality of the conductive through vias.

In even another embodiment, the top surfaces of the plurality of the conductive through vias are electrically disconnected among one another.

In yet another embodiment, the top surfaces of the plurality of the conductive through vias are arranged in a linear array or in a two-dimensional array.

In still another embodiment, the semiconductor structure further comprises a peripheral test structure interconnect layer vertically abutting the peripheral test structural layer and the plurality of conductive through vias.

In still yet another embodiment, the semiconductor structure further comprises at least one functional interconnect layer vertically abutting one of the at least one functional layer.

In a further embodiment, an entirety of the top surfaces of the plurality of the conductive through vias and an entirety of a top surface of one of the at least one functional layer are exposed.

In an even further embodiment, the semiconductor structure further comprises C4 balls located on the top surfaces of the plurality of the conductive through vias.

In a yet further embodiment, the substrate provides mechanical support to the peripheral test structure layer and the at least one functional layer and renders the semiconductor structure portable without attaching a carrier or another substrate.

In a still further embodiment, the peripheral test structure layer comprises at least one of a decompression circuit, a compression circuit, a bandwidth change circuit providing signal paths for a circuit in the at least one functional layer, a plurality of vias which allows a reduction of a scan chain length of a circuit in the at least one functional layer to a number less than 100 by allowing more scan chains, a result compression circuit containing capture points for a circuit in the at least one functional layer, a non-volatile random access memory (NVRAM) circuit that provides a capture of system states, a replication operation, or a hibernation operation for a circuit in the at least one functional layer, a power supply that enables powering down of a circuit in the at least one functional layer, a built-in-self-test (BIST) engine for an array macro in the at least one functional layer, a field programmable gate array (FPGA), a supplementary circuit that provides an analog sampling function for an analog circuit in the at least one functional layer, a buffer component that isolates a circuit of the at least one functional layer from an undesirable load during a test, and a power control circuit that performs management of power aspects of a circuit in the at least one functional layer including voltage regulation, current limiting, and temperature monitoring.

According to another aspect of the present invention, a method of manufacturing a semiconductor structure is provided. The method comprises:

forming a plurality of conductive through vias in a substrate; and forming a peripheral test structure layer containing peripheral test structures directly on the substrate, wherein top surfaces of the plurality of the conductive through vias are exposed on an opposite side of the substrate relative to the peripheral test structure layer and provide access points for testing the peripheral test structures.

In one embodiment, the method further comprises testing the peripheral test structure by landing test pins attached to a test probe directly on the access points.

In another embodiment, the top surfaces of the plurality of the conductive through vias are coplanar with a top surface of the substrate.

In even another embodiment, the top surfaces of the plurality of the conductive through vias are arranged in a linear array or in a two-dimensional array.

In yet another embodiment, the method further comprises forming a peripheral test structure interconnect layer directly on the peripheral test structural layer and the plurality of conductive through vias.

In a further embodiment, the method further comprises forming at least one functional layer containing at least one functional semiconductor circuit directly on the peripheral test structure layer, wherein the top surfaces of the plurality of the conductive through vias provide access points for testing the at last one functional semiconductor circuit.

In an even further embodiment, the method further comprises testing the at least one functional semiconductor circuit by landing test pins attached to a test probe directly on the access points.

In a yet further embodiment, the method further comprises forming at least one functional interconnect layer directly on one of the at least one functional layer.

In a still further embodiment, the method further comprises forming C4 balls directly on the top surfaces of the plurality of the conductive through vias after formation of the at least one functional semiconductor circuit.

In a still yet further embodiment, the method further comprises:
  loading an assembly of the substrate, the peripheral test structure layer, and the at least one functional layer into a substrate test station;
  testing the assembly in the substrate test station; and
  unloading the assembly from the substrate test station, wherein the substrate provides mechanical support to the peripheral test structure layer and the at least one functional layer and renders the assembly portable without attaching a carrier or another substrate.

DETAILED DESCRIPTION OF THE INVENTION

Figure 1A:
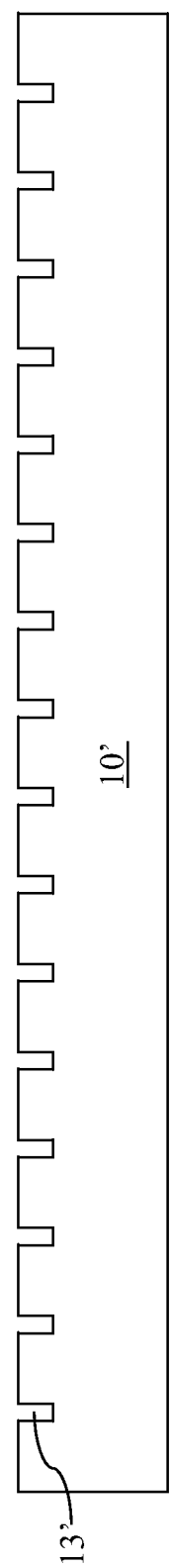
FIGS. 1A-1U are sequential vertical cross-sectional views of an exemplary prior art three-dimensional semiconductor structure having an integrated peripheral test structure layer during the steps of manufacturing and testing.
Figure 1B:
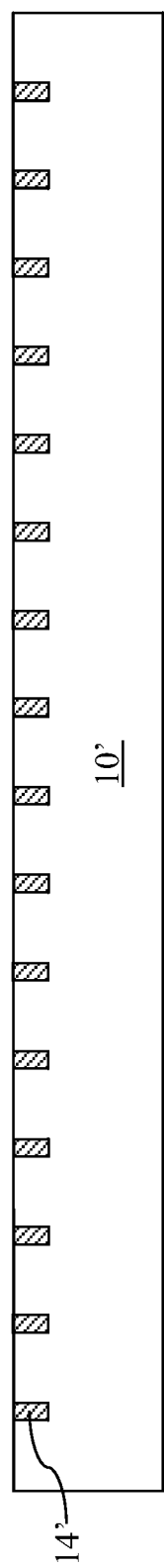
Figure 1C:
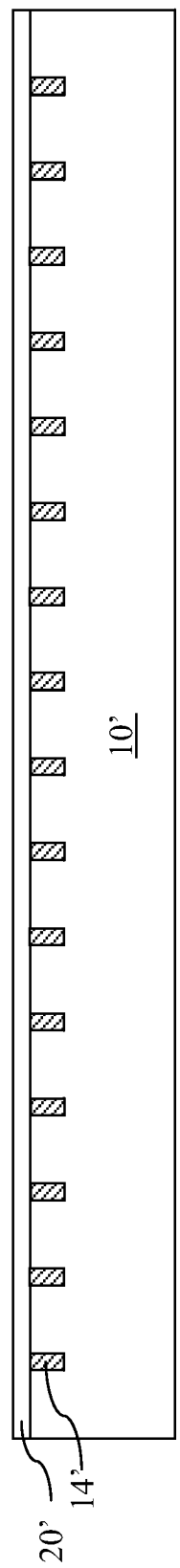
Figure 1D:
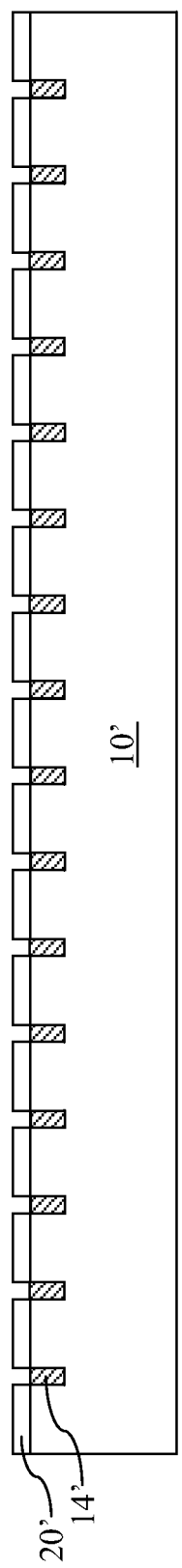
Figure 1E:
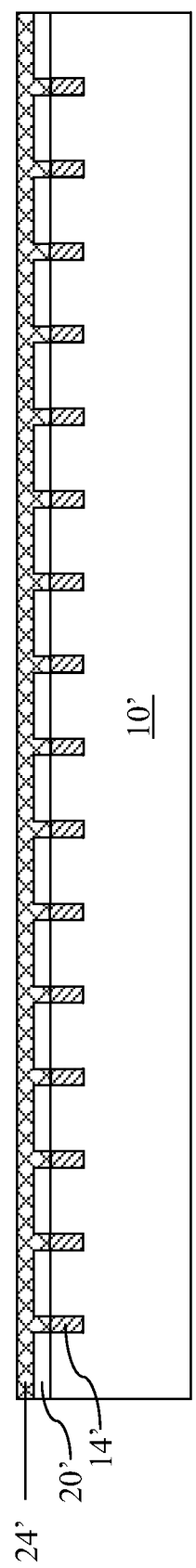
Figure 1F:
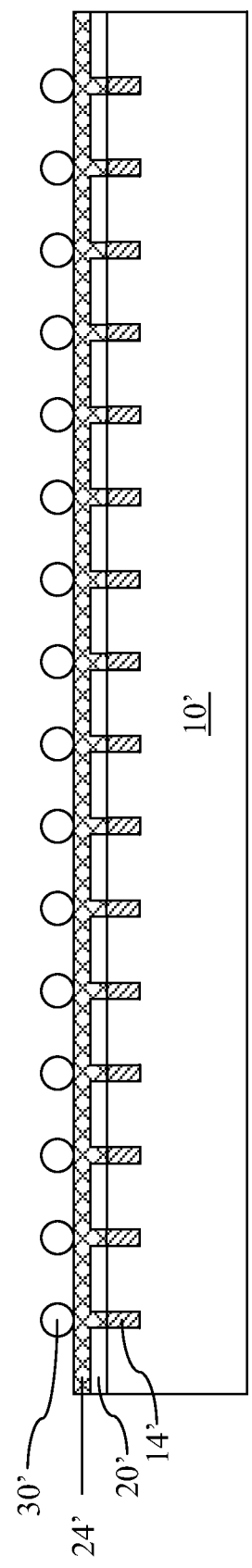
Figure 1G:
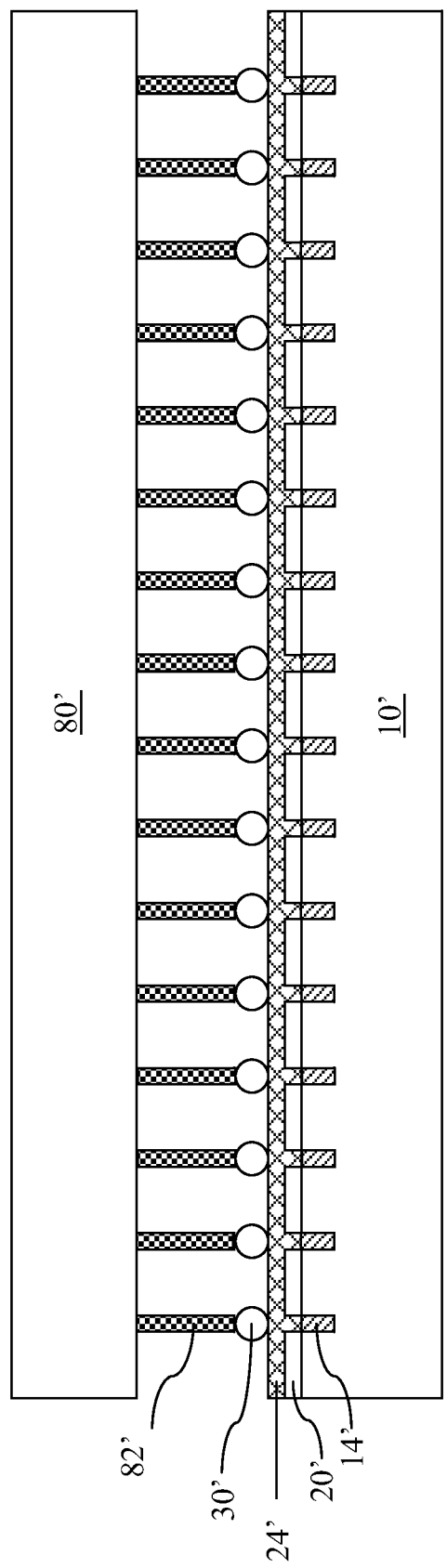
Figure 1H:
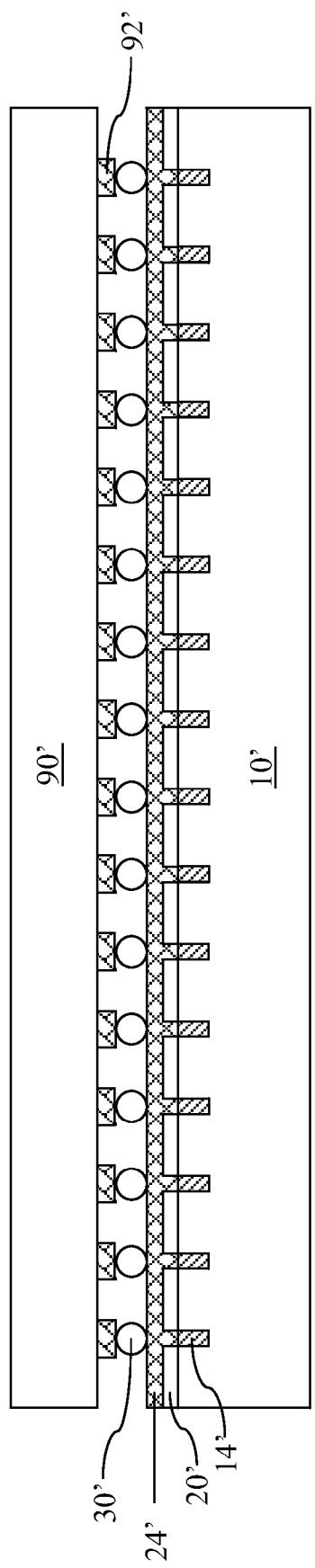
Figure 1I:
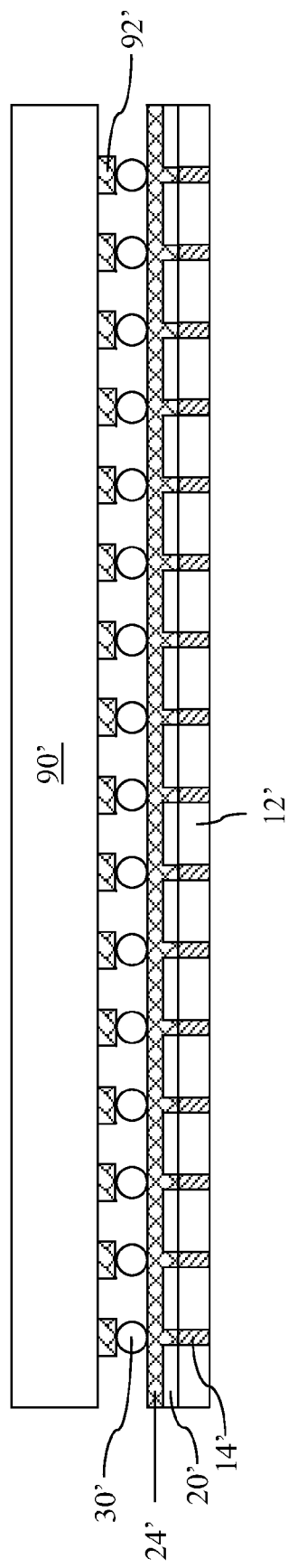
Figure 1K:
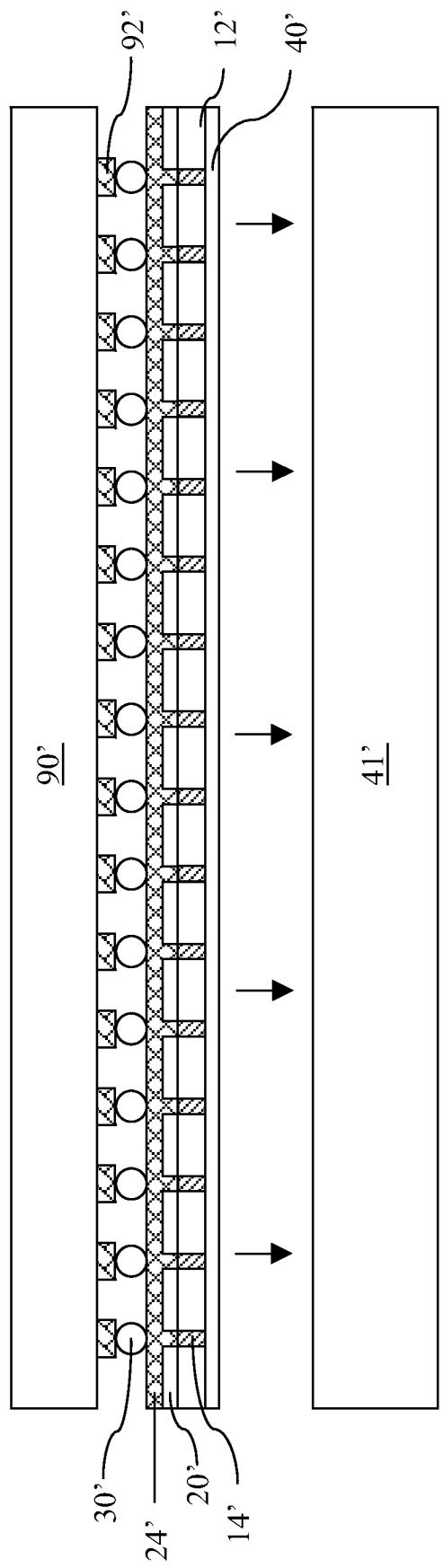
Figure 1L:
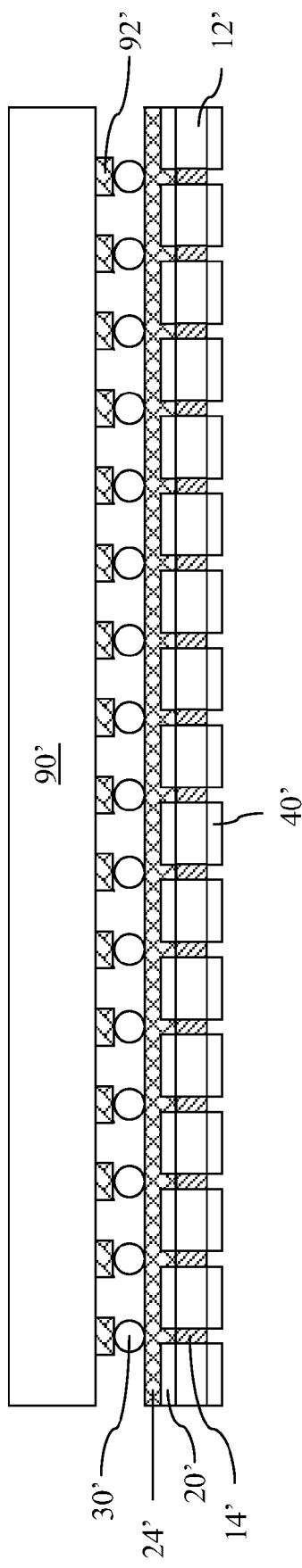
Figure 1M:
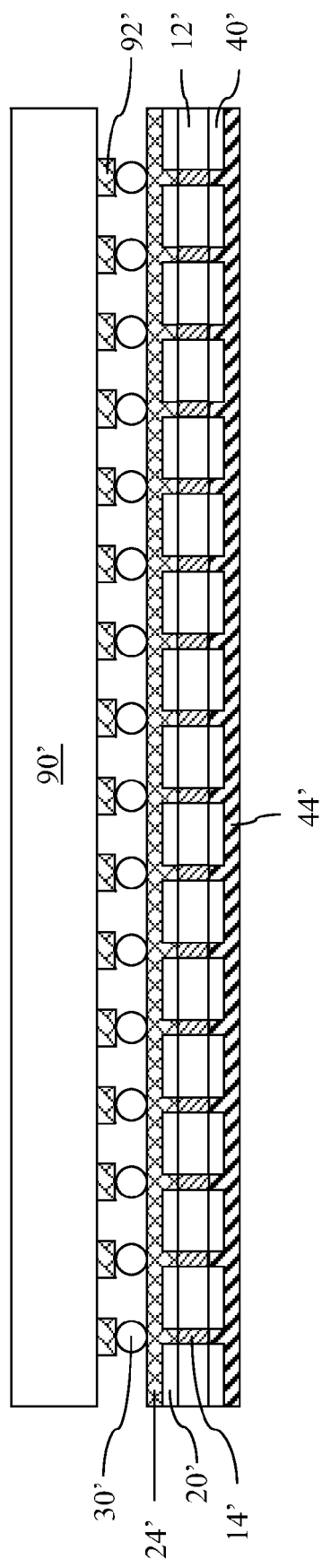
Figure 1N:
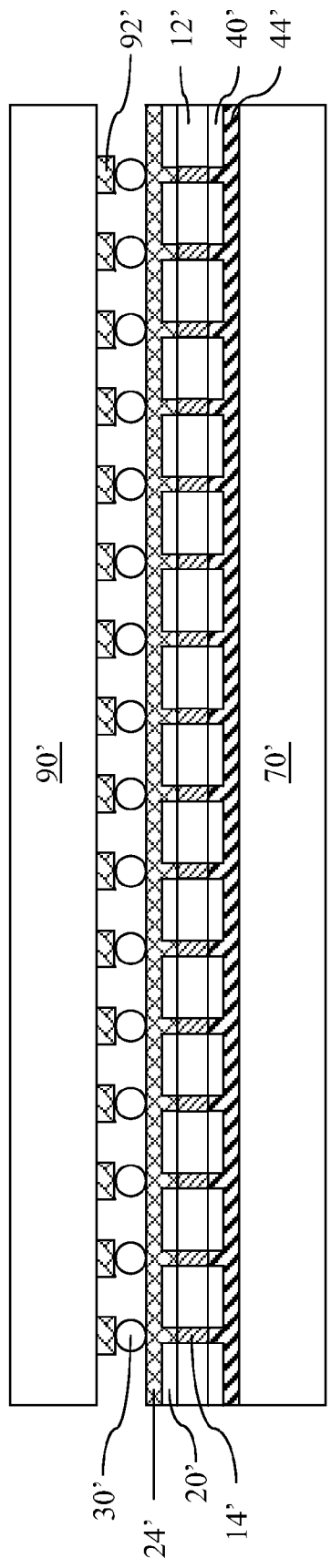
Figure 10:
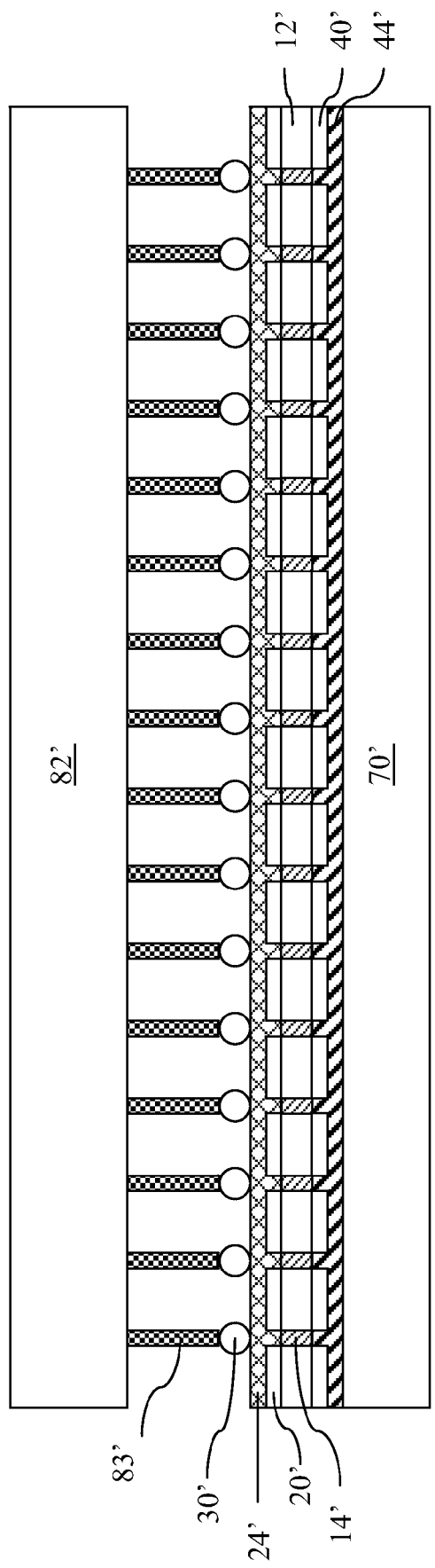
Figure 1P:
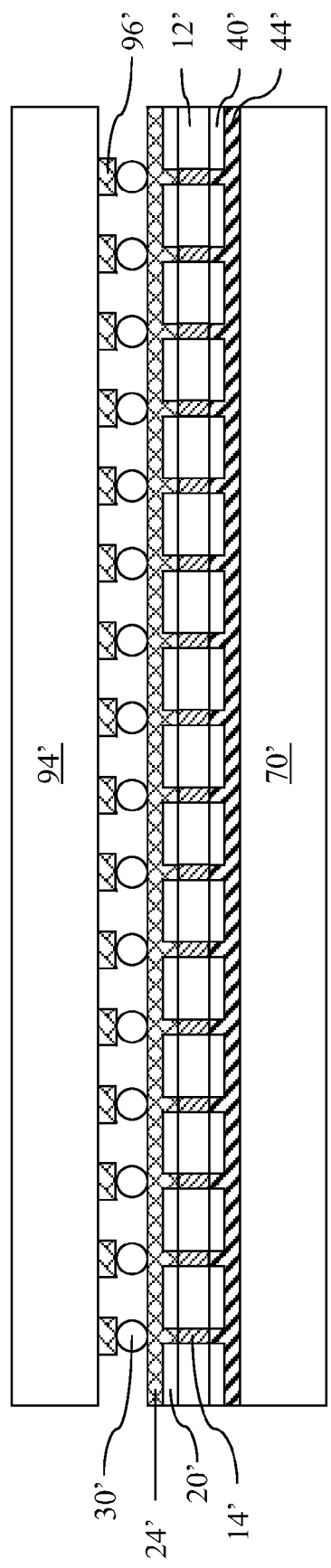
Figure 1Q:
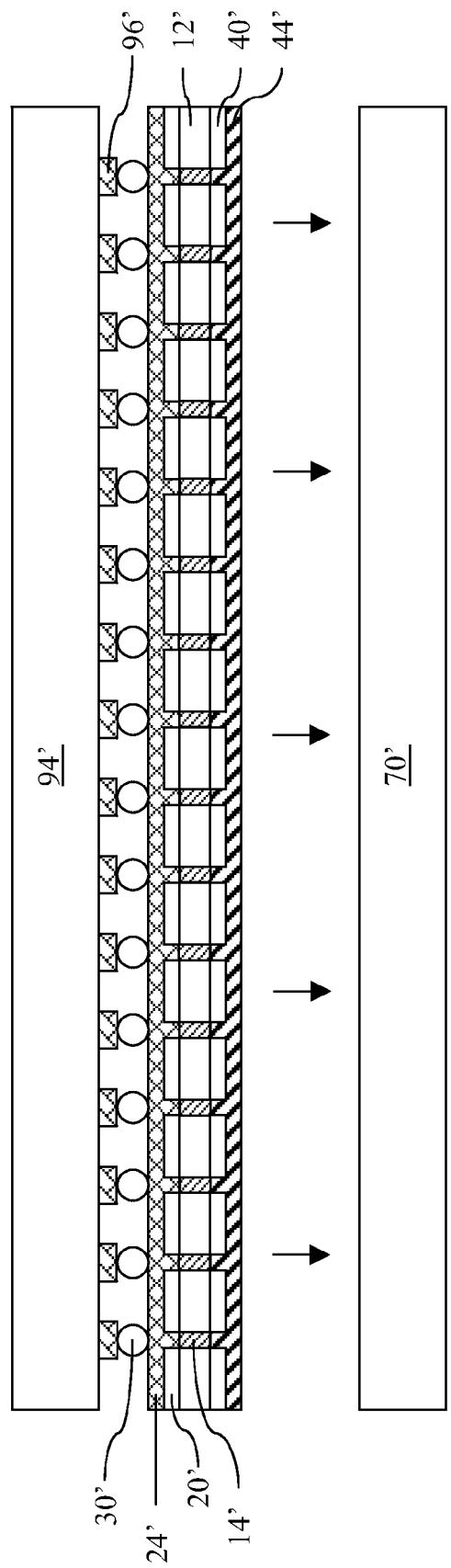
Figure 1R:
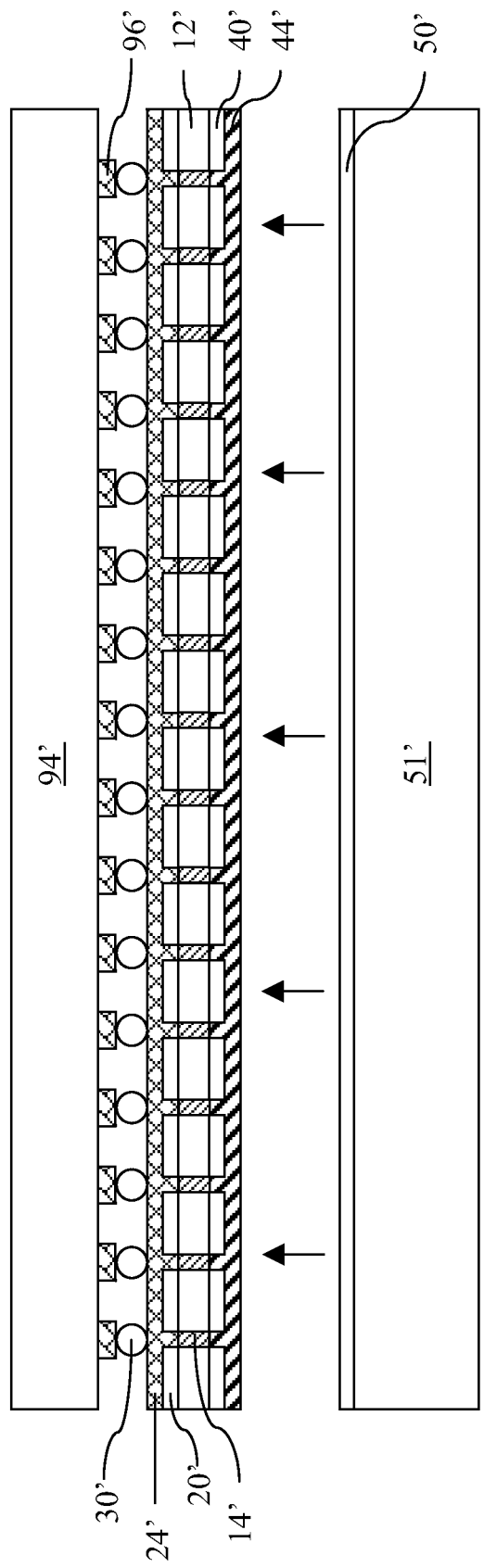
Figure 1S:
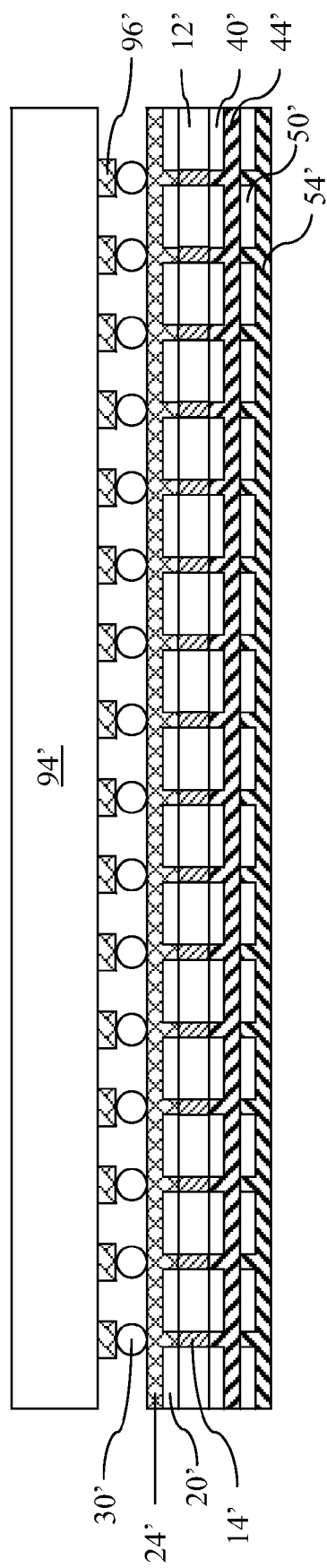
Figure 1T:
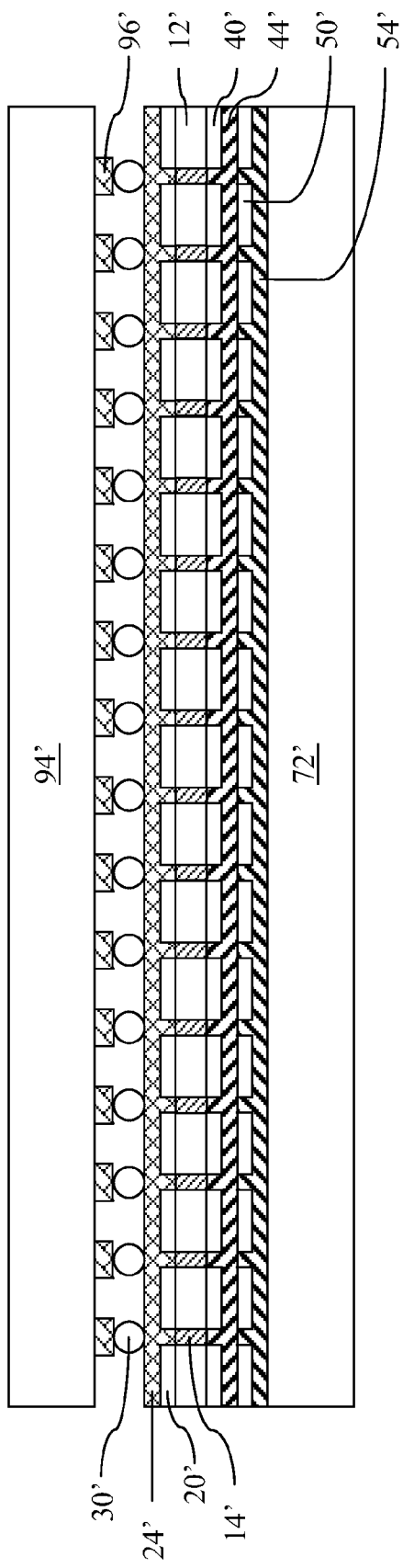
Figure 1U:
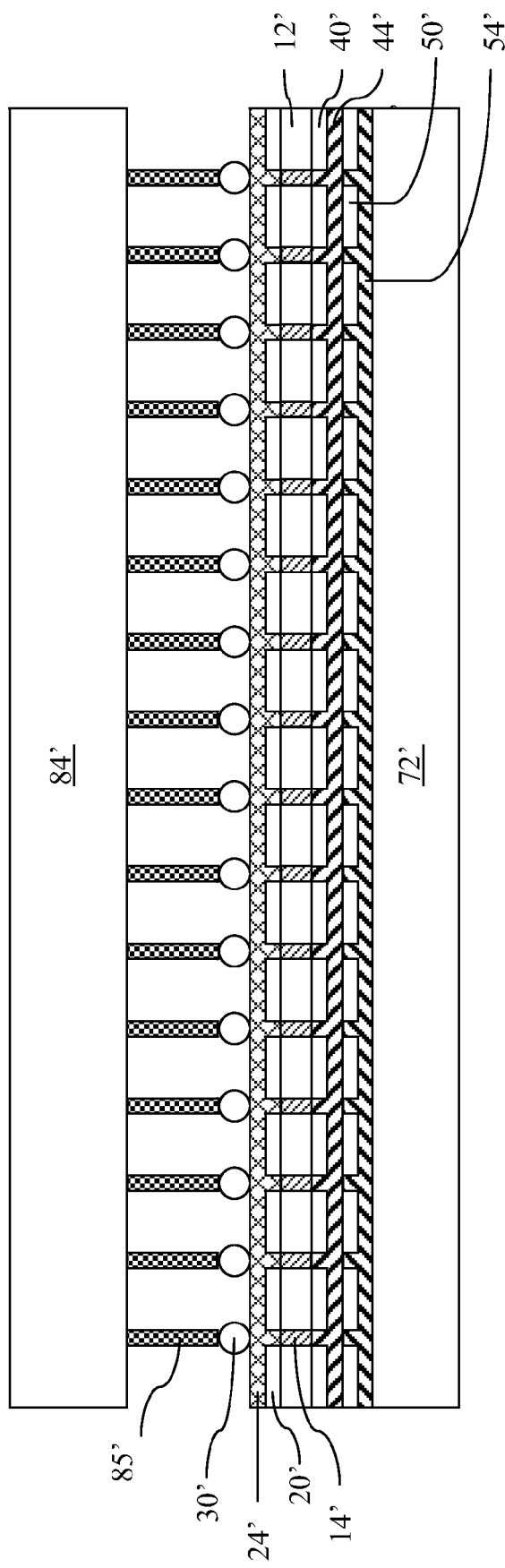

As stated above, the present invention relates to structures and methodology for testing three-dimensional semiconductor structures having multiple functional layers, which are now described in detail with accompanying figures. It is noted that like and corresponding elements are referred to by like reference numerals.

Referring to FIG. 2A, a substrate is provided in a first step of a manufacturing sequence of an exemplary semiconductor structure according to the present invention. The substrate is herein referred to as a peripheral test structure substrate (PTSS) 12. The PTSS 12 may comprise an insulator material or a semiconductor material. For example, the PTSS 12 may be a commercially available silicon substrate in the form of a circular disc having a diameter of 300 mm, 200 mm, or 150 mm. The thickness of the PTSS 12 may be from about 0.4 mm to 1.0 mm, although lesser and greater thicknesses are also explicitly contemplated herein.

Figure 2B:
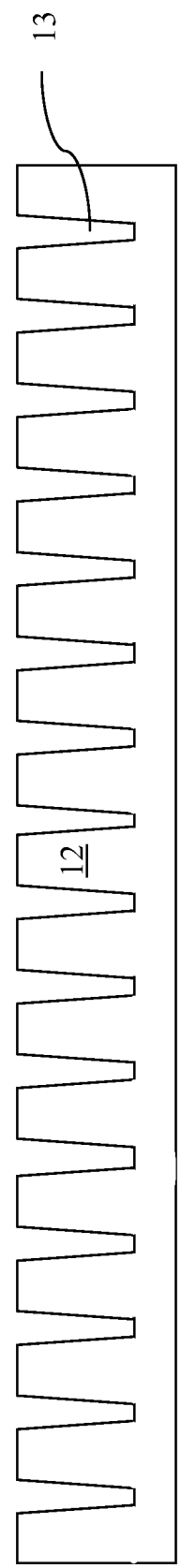
FIGS. 2A-2Y are sequential vertical cross-sectional views of an exemplary three-dimensional semiconductor structure having an integrated peripheral test structure layer according to the present invention during the steps of manufacturing and testing.

Referring to FIG. 2B, a plurality of via holes are formed in the substrate by lithographic patterning and etching. The plurality of via holes is herein referred to as a plurality of peripheral test structure substrate (PTSS) through via holes 13. The plurality of the PTSS through via holes 13 may be formed through the PTSS 12, or may be formed through a substantial portion of the thickness of the PTSS 12, but not through the entirety of the PTSS 12. The pitch of the plurality of the PTSS through via holes 13 may be 150 µm or 200 µm to be commensurate with the periodicity of commercially available C4 bonding pad arrangements. Alternately, the pitch of the plurality of the PTSS through via holes 13 may be on the order of the minimum allowable pitch of commercially available probe pins, such as 20 µm. Lesser and greater pitches are also explicitly contemplated herein. In general, the pitch of the PTSS through via holes 13 may be commensurate with the pitch of the probe pins of a test probe to be subsequently employed to test the exemplary semiconductor structure.

Figure 2C:
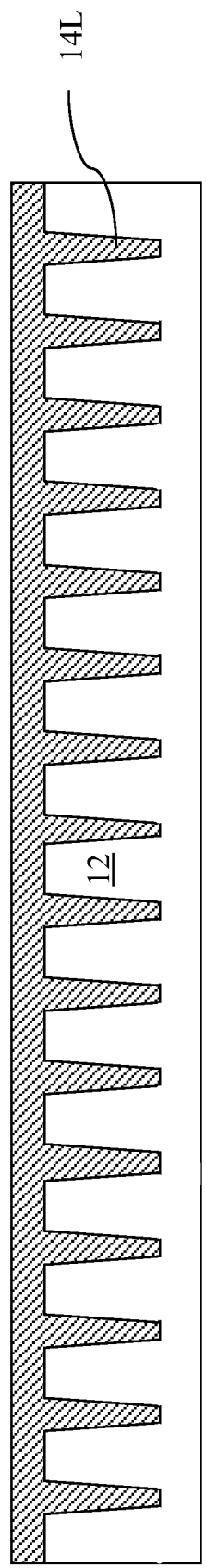

Referring to FIG. 2C, a metal layer 14L is deposited in the PTSS through via holes 13, for example, by electroplating or electroless plating. The metal layer 14L may comprise gold, silver, copper, platinum, nickel, or other metal that may be deposited by electroplating or electroless plating. The metal layer 14L is contiguous at this point.

Figure 2D:
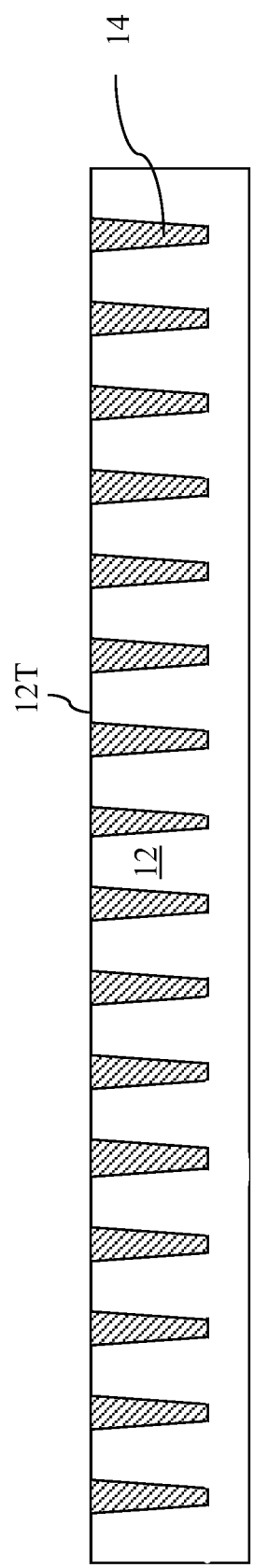

Referring to FIG. 2D, the metal layer 14L is planarized to form a plurality of peripheral test structure substrate (PTSS) through vias 14. Each of the plurality of the PTSS through vias 14 is disjoined from other PTSS through vias 14. Exposed top surfaces of the plurality of the PTSS through vias are coplanar with a top surface of the PTSS 12, or a "PTSS top surface" 12T.

Figure 2E:
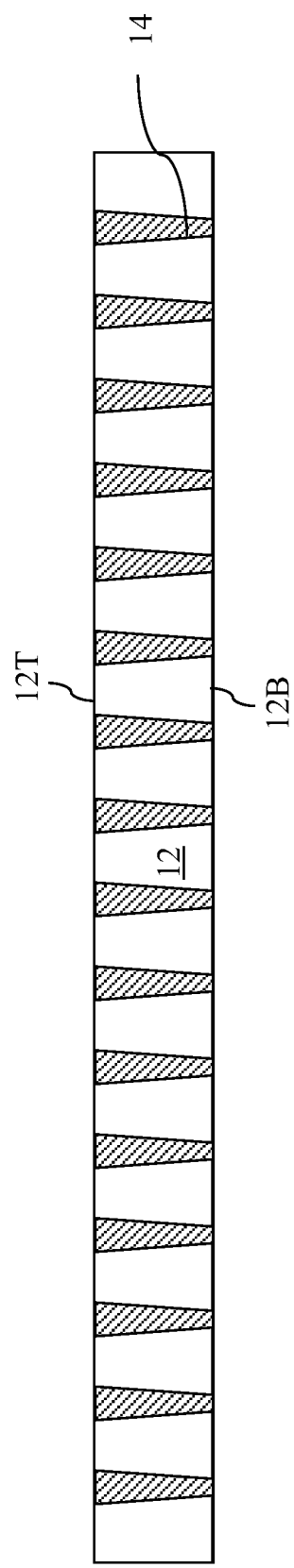

Referring to FIG. 2E, a bottom portion of the PTSS 12 is removed by a backside grinding (BSG) of the PTSS 12 to expose bottom surfaces of the plurality of the PTSS through vias 14 if the bottom surfaces are not already exposed. The PTSS 12 at this point contains a plurality of PTSS through vias 14 having top surfaces that are coplanar with the PTSS top surface 12T and having bottom surfaces that are coplanar with a bottom surface of the PTSS 12, or a "PTSS bottom surface" 12B. The plurality of the PTSS through vias 14 is a plurality of conductive through vias extending from the PTSS top surface 12T to the PTSS bottom surface 12B. The plurality of the PTSS through vias may be arranged in a linear array or in a two-dimensional array. The PTSS 12 has sufficient mechanical strength to be handled without attaching a carrier or another substrate. The PTSS 12 containing the plurality of the PTSS through vias 14 is portable. The plurality of the PTSS through vias 14 may have a taper within the PTSS 12, or may have substantially constant vertical cross-sectional areas irrespective of the height of the vertical cross-section.

Figure 2F:
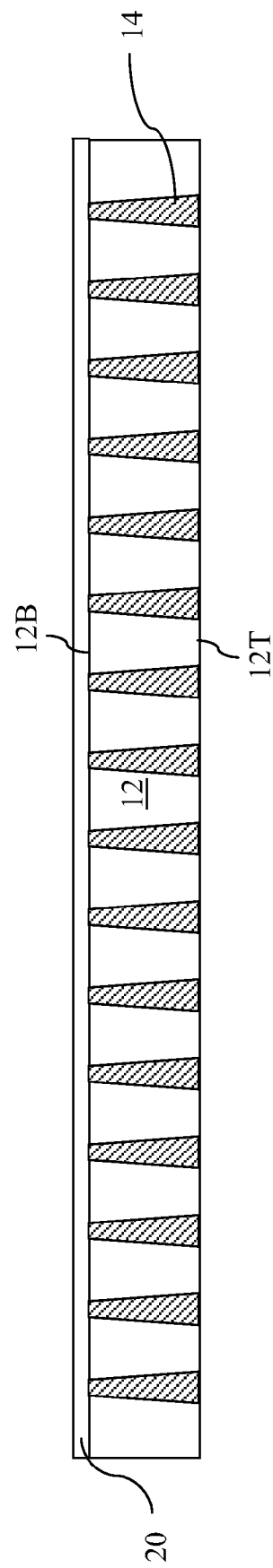

Referring to FIG. 2F, the PTSS 12 is flipped around and a peripheral test structure layer (PTSL) 20 is formed on the PTSS bottom surface 12B and an array of the bottom surfaces of the plurality of the PTSS through vias 14. The upper surface of the PTSL 20 may, or may not, contain metal contacts, metal lines, metal vias, or other metal interconnect structures that provide electrical connections to the circuits in the PTSL 20. The regions of the PTSL 20 directly above each of the plurality of the PTSS through vias 14 are typically reserved for subsequently making electrical contacts to the plurality of the PTSS through vias 14 as described below.

The PTSL 20 contains various test circuits providing various functions. Different technology ground rules may be employed for patterning the circuits in the PTSL 20 than for patterning at least one functional layer to be subsequently formed. Thus, the performance and yield of the PTSL 20 may be optimized by selecting the ground rules for the PTSL 20.

Placement of a large test circuit in the PTSL 20 is more economical than placing such a structure in a single layer semiconductor structure. Various decompression and compression schemes may be employed to speed up a scan process by providing multiple parallel data paths within the PTSL 20 since more test circuit may be incorporated in the PTSL 20 than would be practical in a single layer semiconductor structure.

The test circuits may be placed in close proximity to the at least one functional layer to be subsequently formed. Proximity of the PTSL 20 to the at least one functional layer to be subsequently formed provides high connectivity between the PTSL 20 and the at least one functional layer. In contrast, the connectivity between functional semiconductor circuits and test circuits is limited by the number of input/output pins that are available in a mission mode of the single layer semiconductor structure to transfer test data in and out of the test circuits. Thus, the bandwidth of the signal path between the PTSL 20 and the at least one functional layer is orders of magnitude greater than comparable bandwidth between the functional test circuits and test circuits in the single layer semiconductor structure.

The test circuits may be employed to diagnose chip failures. Since the PTSL 20 enables placement of a large circuit that is needed to capture or save circuit failure related data for the purposes of chip failure mode analysis or for the purposes of reproducing or taking a snapshot of the failure inducing conditions.

In case the at least one functional layer to be subsequently formed contains a processor core or other complex analog or digital circuits, the PTSL 20 may employ a shadow layer of latches and logic and analog circuits for the at least one functional layer. The ratio of the number of latches in the PTSL 20 to the number of latches in the circuit in the at least one functional layer may be relatively low, e.g., from 1 to about 300, and preferably from 1 to about 100, and more preferably from about 1 to 30. This contrasts with the many thousands in the ratio of the number of latches in a functional semiconductor circuit to the number of latches in a test circuit in a single layer semiconductor structure. A large number of latches in the PTSL 20 effectively makes the scan chain length of the at least one functional layer to approach or become 1 for various implementations of pattern decompression and compression. This may be effected by designing a pattern decompressor circuit in the PTSL 20 to have a high number of outputs such that the scan path in the processor or other logic circuits in the at least one functional layer can be made very short, i.e., equal to 1 or a small number such as less than 300, or preferably less than 30. Such an effectively small scan chain length is accomplished by a high number of interconnect structures enabled by proximal placement of the at least one functional layer to the PTSL 20.

Further, self contained test pattern generation and comparison of test results with a template pattern may be performed within the PTSL 20. Also, result compression circuits containing result capture points may be formed within the PTSL 20 to facilitate diagnosis of a circuit failure, and the identification of failing latches may be facilitated in a small number of cycling of data through the latches in the PTSL as the effective scan chain length approaches 1.

The latch circuit in the PTSL 20 may employ non-volatile random access memory (NVRAM) circuit such as a flash memory array. In this case, a three-dimensional semiconductor circuit containing the PTSL and the at least one functional layer may be powered down with the state of a circuit in the at least one functional layer captured in the NVRAM circuit. The circuit in the at least one functional layer may resume operation upon loading a copy of the state of the circuit at the time of the power down from the NVRAM circuit. Implementation of some or all of the latches in the NVRAM circuit permits a capture of system states for diagnosis or "replication/hibernation" operation as well as permitting the three-dimensional semiconductor circuit to be powered down and later to restore the three-dimensional semiconductor circuit back to the state it was in at the time of the capture. Data from all the latches in the processor or logic circuit in the at least one functional layer is transmitted up to the PTSL 20 through a large number of interconnect vias between the PTSL 20 and the at least one functional layer, and subsequently captured into the NVRAM circuit. When the effectively small scan chain length described above becomes 1 and the latch comprises an NVRAM circuit, a state of the a circuit in the at least one functional layer may be captured into the NVRAM circuit.

The circuits in the PTSL 20 may be designed with either a separate or switchable power supply such that circuits in the PTSL can be powered down for reducing power consumption while not being used functionally. Typically, the circuits in the PTSL 20 are powered down to avoid the power consumption while the PTSL 20 is not used for either system diagnosis or for test purposes.

A built-in-self-test (BIST) engine for an array macro such as a static random access memory (SRAM) array, a dynamic random access memory (DRAM) array, a field programmable gate array (FPGA) or another macro may be implemented with a large number of gates and on a larger area so that the BIST engine runs faster and offers a higher level of diagnosability on the three-dimensional semiconductor structure than would be possible or practical on a single layer semiconductor structure. The faster speed of the BIST engine and the higher level of diagnosability is provided both by the large number of gates and by the proximity of the BIST engine to the circuit under test since a massively parallel data paths are provided by interconnect vias between the vertically stacked structure of the PTSL 20 and the at least one functional layer within the three-dimensional semiconductor structure.

Further, a field programmable gate array (FPGA) may be provided within the PTSL 20 so that functional features of the PTSL 20 may be programmed or reprogrammed as needed during testing or operation of the three-dimensional semiconductor structure which may be incorporated in a semiconductor chip. The FPGA may comprise a system level error correction circuitry for a logic circuit in the at least one functional layer to functionally replace a failing portion of the logic circuit during testing or operation.

The PTSL 20 may be employed in conjunction with an analog circuit in the at least one functional layer to provide an analog sampling function, which can measure and capture, as a function of time and/or voltage, analog characteristics of a circuit in the at least one functional layer such as clock skew from a local clock gate (LCG) to another local clock gate (LCG), any differential time between a pair of circuit components, supply voltage levels variations across the circuit, and/or ground voltage level variation across the circuit.

In case a circuit load presented by a circuit in the PTSL 20 is destructive, a buffer component may be formed in one of the at least one functional layer to isolate a circuit of the at least one functional layer that is under test from the undesirable load. In the situations where accurate time coherent measurements are necessary, a oscillator ring may be formed in the PTSL 20 such that a single relative time measurement can be made.

The PTSL 20 may contain a power control circuit that performs management of power aspects of circuits in the at least one functional layer including voltage regulation, current limiting, and temperature monitoring. The power control circuit may have different operation parameter settings for each operation mode such as a test mode, a reliability testing mode, and a normal operation mode. On-chip voltage regulation may reduce supply voltage noises, i.e., voltage drop, caused by IR losses through packaging. Such on-chip voltage regulation enables lower operating voltages which in turn would reduce overall power and thermal requirements, possibly enough to offset the extra power consumption of the on-chip voltage regulation circuit.

Figure 2G:
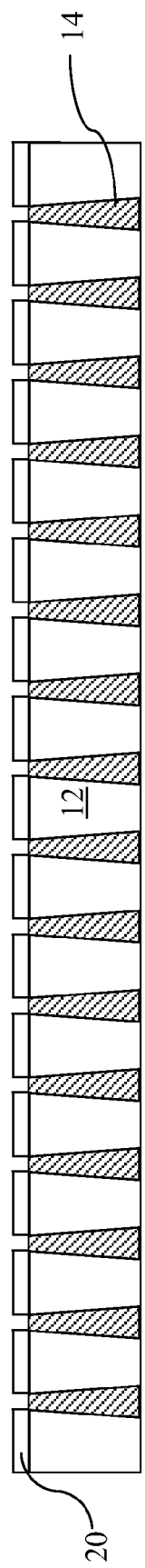

Referring to FIG. 2G, the PTSL 20 is patterned to expose bottom surfaces of the plurality of the PTSS through vias 14. Lithographic methods and an etch may be employed to effect this processing step.

Figure 2H:
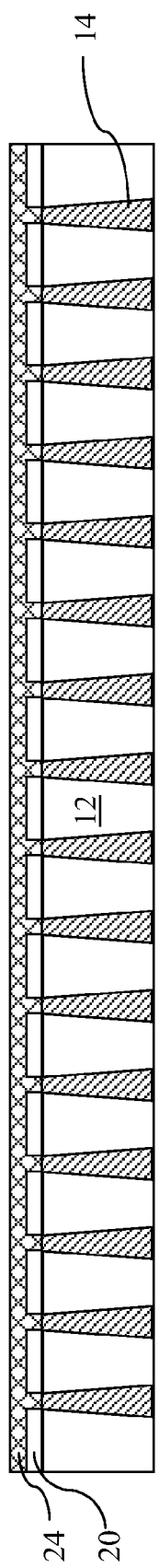

Referring to FIG. 2H, a peripheral test structure interconnect layer (PTSIL) 24 is formed on the PTSL 20 and on the bottom surfaces of the plurality of the PTSS vias 14. The PTSIL 24 contains metal interconnect structures that provide electrical connection to the various test circuits in the PTSL 20 and to the plurality of the PTSS through vias 14. The PTSIL 24 may be formed by deposition of a metal layer followed by patterning of the metal layer. Alternately, the PTSIL 24 may be formed by deposition of a dielectric material layer followed by patterning of the dielectric material layer, deposition of a metal layer, and planarization of the metal layer. The PTSIL 24 may contain a single layer metal vias and a single layer of metal lines, or may contain multiple layers of metal vias and multiple layers of metal lines.

Figure 2I:
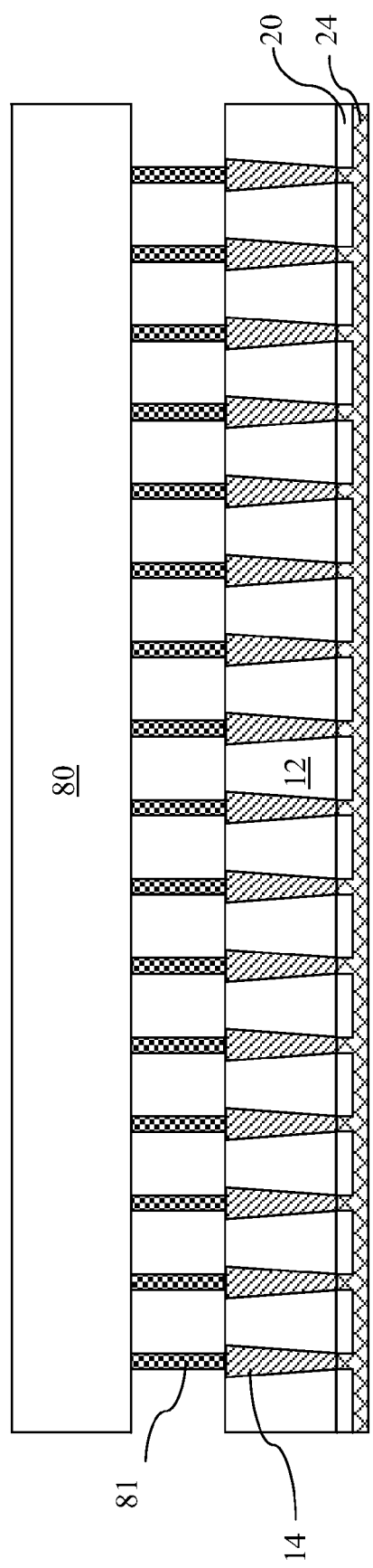

Referring to FIG. 2I, the exemplary semiconductor structure containing the PTSS 12, the plurality of the PTSS through vias 14, the PTSL 20, and the PTSIL 24 is flipped upside down and loaded onto a substrate test station (not shown) that is connected to a tester (not shown). A first test probe 80 to which a first set of test pins 81 is attached is also loaded into the substrate test station. The first set of test pins 81 contacts the top surfaces of the plurality of the PTSS through vias 12. Testing is performed to ascertain the functionality of the PTSL 20 within each semiconductor die. While the yield of the exemplary semiconductor structure is typically high at this point since the PTSL 20 typically employs relaxed ground rule structures, any defective dies are recorded into a test data tracking system so that the defective dies may be excluded from future testing and eventually discarded.

Figure 2J:
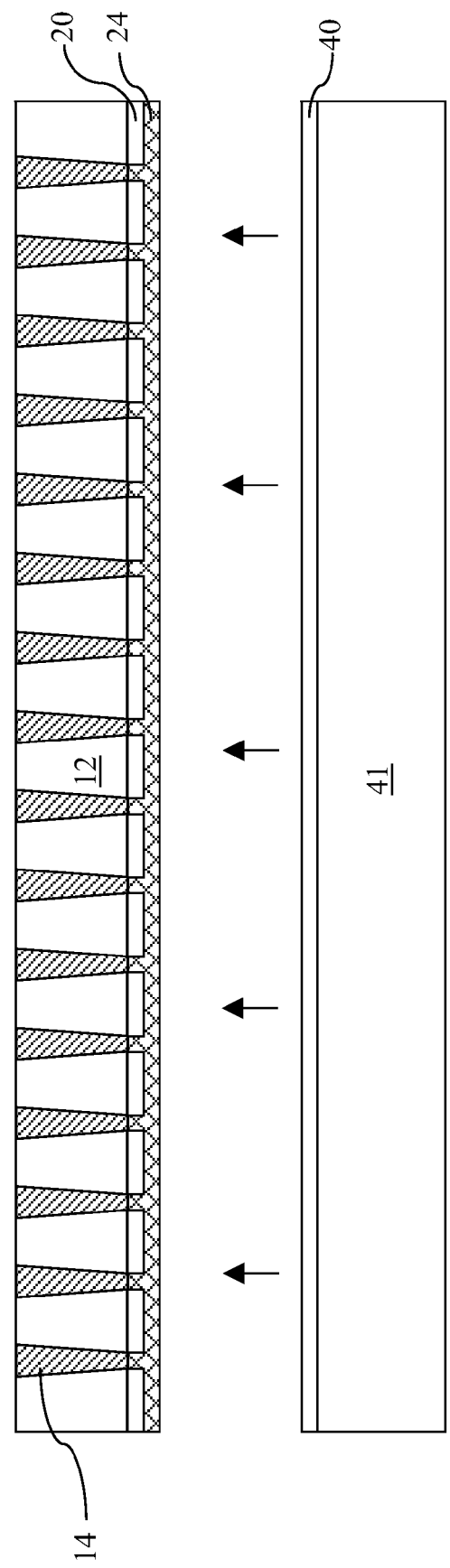

Referring to FIG. 2J, the exemplary semiconductor structure is unloaded from the substrate test station. A first functional layer carrier 41 having a first functional layer 40 is brought into contact with an exposed surface of the PTSIL 24, which is also a bottom surface of the assembly of the exemplary semiconductor structure containing the PTSS 12, the plurality of the PTSS through vias 14, the PTSL 20, and the PTSIL 24. The first functional layer 40 is aligned to the components of the PTSIL 24. The first functional layer 40 is one of the at least one functional layer discussed above. The first functional layer 40 comprises a first set of functional semiconductor circuits, which may contain logic circuits such as a processor core, various levels of cache memory, embedded memory, e.g., embedded dynamic random access memory (eDRAM), or analog circuits such as radio frequency (RF) or microwave circuits. The first set of functional semiconductor circuits may contain any other known semiconductor circuits. Preferably, the first functional layer 40 contains little or no test circuits since test circuits are primarily formed in the PTSL 20.

Figure 2K:
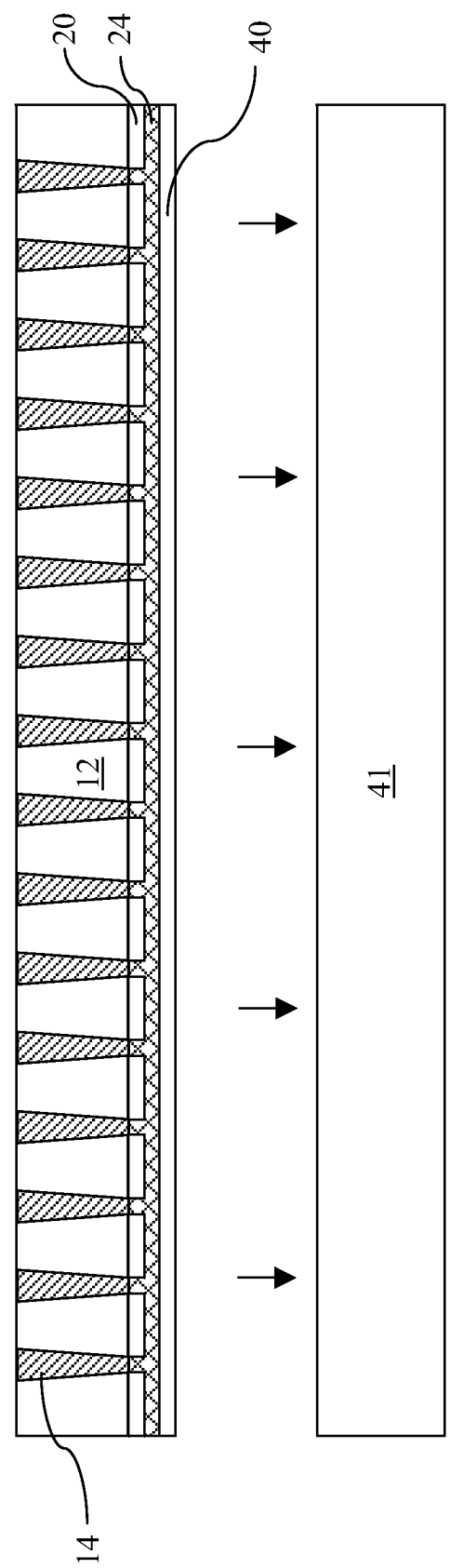

Referring to FIG. 2K, the first functional layer 40 is bonded to the exposed surface of the PTSIL 24 by methods known in the art. Thereafter, the first functional layer carrier 41 is removed. Methods such as separation by a hydrogen implanted layer, or any other method known in the art for separating a carrier substrate may be employed to separate the first functional layer carrier 41 from the first functional layer 40.

Figure 2L:
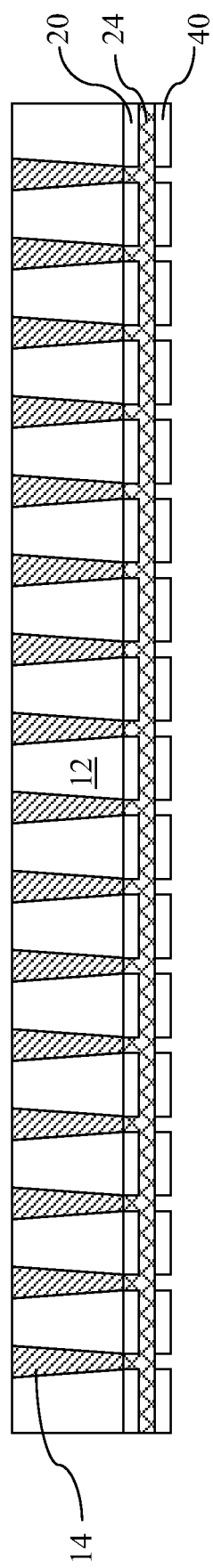

Referring to FIG. 2L, the first functional layer 40 is patterned to expose portions of the PTSIL 24 to which further interconnect structures are to be connected.

Figure 2M:
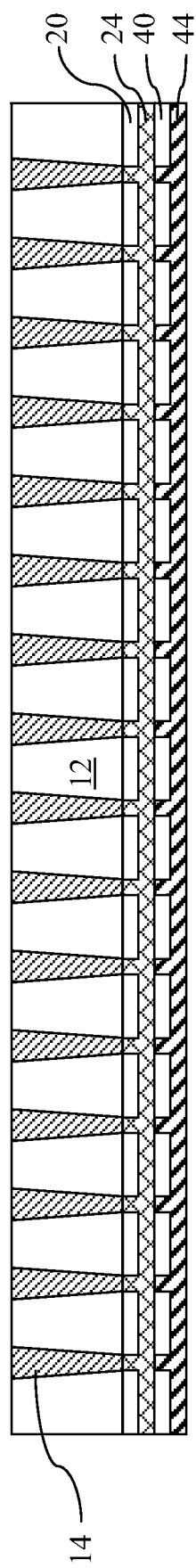

Referring to FIG. 2M, a first functional interconnect layer 44 is formed on the first functional layer 40 and on the exposed portions of the PTSIL 24. The first functional interconnect layer 44 may be formed by deposition of a metal layer followed by patterning of the metal layer. Alternately, the first functional interconnect layer 44 may be formed by deposition of a dielectric material layer followed by patterning of the dielectric material layer, deposition of a metal layer, and planarization of the metal layer. The first functional interconnect layer 44 contains metal interconnect structures that provide electrical connection to the first set of functional semiconductor circuits in the first functional interconnect layer 40 and to the metal interconnect structures in the exposed portions of the PTSIL 24. The first functional interconnect layer 44 is patterned with the metal interconnect structures and insulator regions that provide electrical isolation between the metal interconnect structures.

Figure 2N:
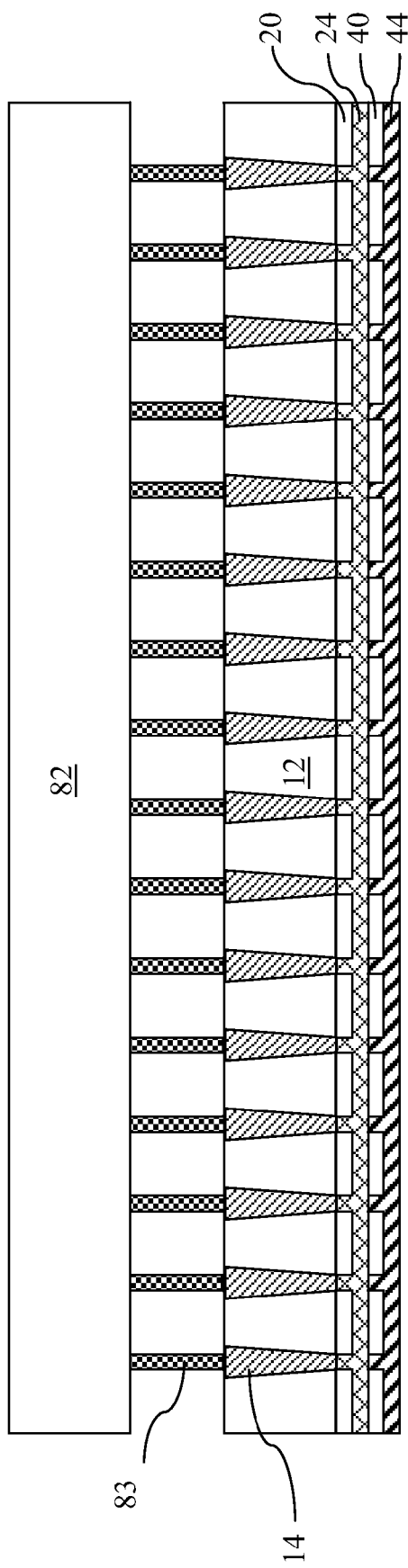

Referring to FIG. 2N, the assembly of the exemplary semiconductor structure containing the PTSS 12, the plurality of the PTSS through vias 14, the PTSL 20, and the PTSIL 24, the first functional layer 40, and the first functional interconnect layer 44 is loaded onto a substrate test station (not shown) that is connected to a tester (not shown). A second test probe 82 to which a second set of test pins 83 is attached is also loaded into the substrate test station. The second set of test pins 83 contacts the top surfaces of the plurality of the PTSS through vias 14 of the exemplary semiconductor structure. Testing is subsequently performed to ascertain the functionality of the first functional layer 40 within each semiconductor die. Any defective dies are recorded into the test data tracking system so that defective dies may be excluded from future testing and eventually discarded. The second test probe 82 may, or may not, be the same as the first test probe 80.

Figure 2O:
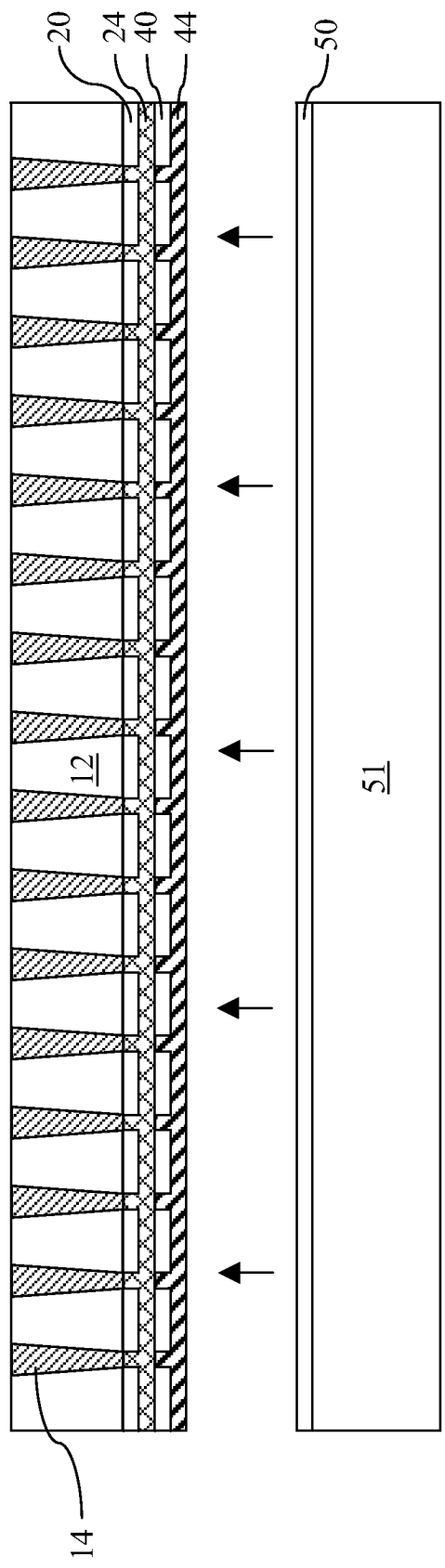

Referring to FIG. 2O, the exemplary semiconductor structure is unloaded from the substrate test station. A second functional layer carrier 51 having a second functional layer 50 is brought into contact with an exposed surface of the first functional interconnect layer 44, which is also a bottom surface of the assembly of the exemplary semiconductor structure containing the PTSS 12, the plurality of the PTSS through vias 14, the PTSL 20, the PTSIL 24, the first functional layer 40, and the first functional interconnect layer 44. The second functional layer 50 is aligned to the components of the first functional interconnect layer 44. The second functional layer 50 is another one of the at least one functional layer discussed above. The second functional layer 50 comprises a second set of functional semiconductor circuits, which may contain logic circuits, analog circuits, and/or any other known semiconductor circuits. Preferably, the second functional layer 50 contains little or no test circuits since test circuits are primarily formed in the PTSL 20.

Figure 2P:
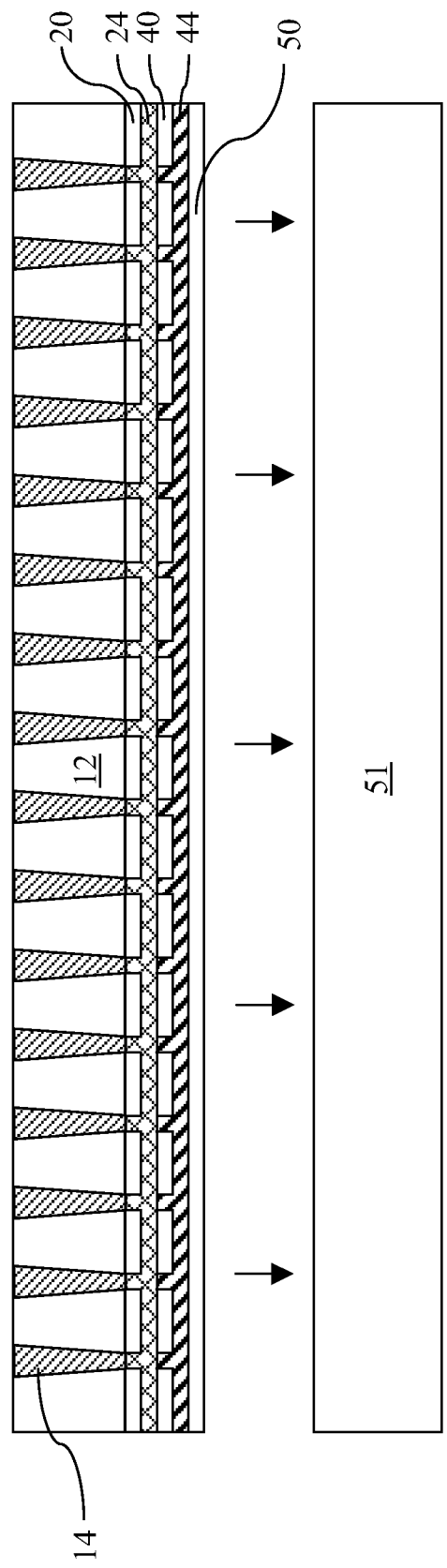

Referring to FIG. 2P, the second functional layer 50 is bonded to the exposed surface of the first functional interconnect layer 44 by methods known in the art. Thereafter, the second functional layer carrier 51 is removed. Methods known in the art for separating a carrier substrate may be employed to separate the second functional layer carrier 51 from the second functional layer 50.

Figure 2Q:
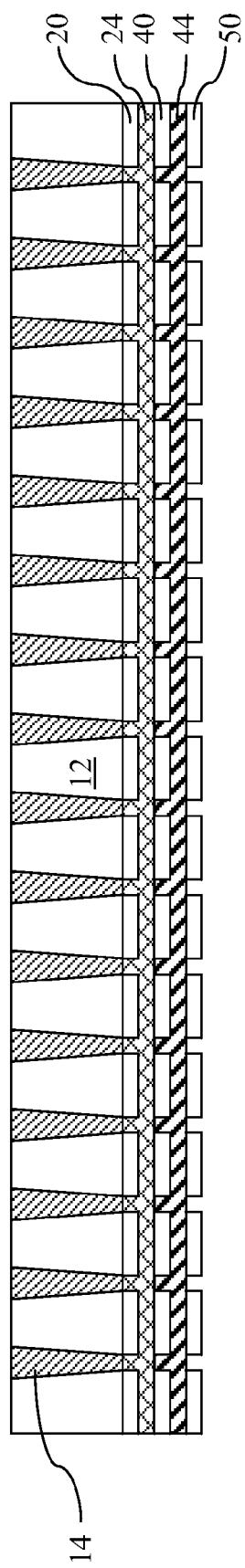

Referring to FIG. 2Q, the second functional layer 40 is patterned to expose portions of the first functional interconnect layer 44 to which further interconnect structures are to be connected.

Figure 2R:
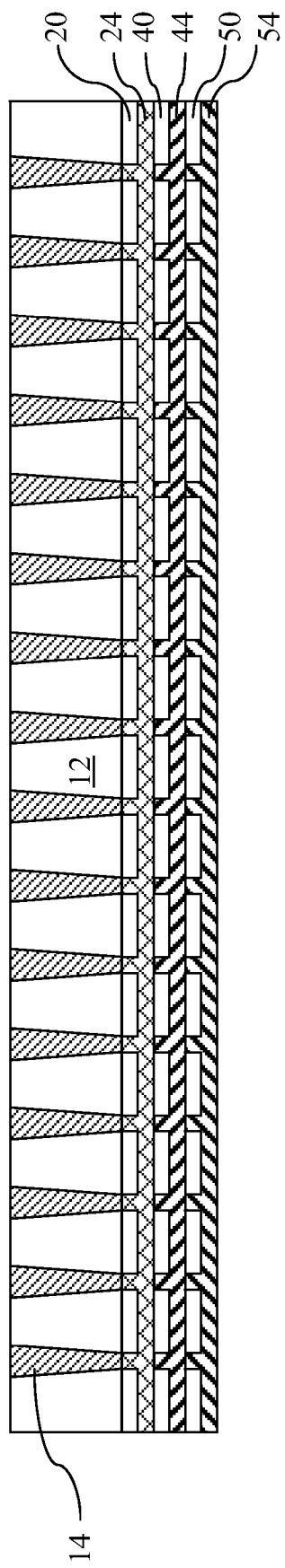

Referring to FIG. 2R, a second functional interconnect layer 54 is formed on the second functional layer 50 and on the exposed portions of the first functional interconnect layer 44. The second functional interconnect layer 54 may be formed by deposition of a metal layer followed by patterning of the metal layer. Alternately, the second functional interconnect layer 54 may be formed by deposition of a dielectric material layer followed by patterning of the dielectric material layer, deposition of a metal layer, and planarization of the metal layer. The second functional interconnect layer 54 contains metal interconnect structures that provide electrical connection to the second set of functional semiconductor circuits in the second functional interconnect layer 50 and to the metal interconnect structures in the exposed portions of the first functional interconnect layer 44. The second functional interconnect layer 54 is patterned with the metal interconnect structures and insulator regions that provide electrical isolation between the metal interconnect structures.

Figure 2S:
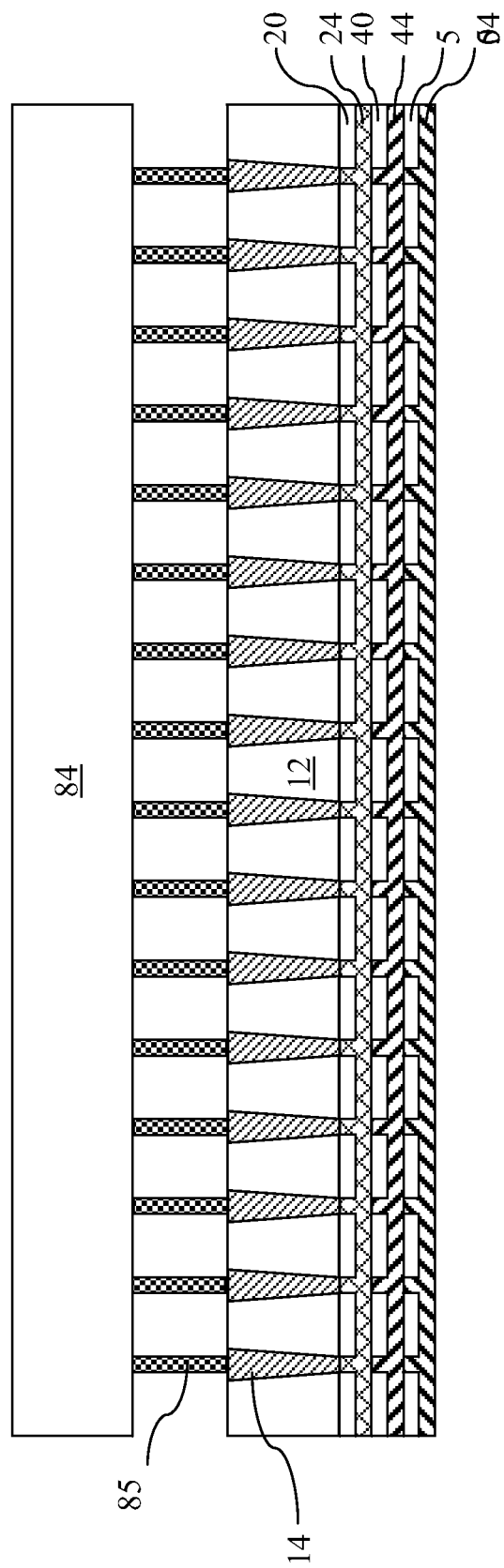
Figure 2T:
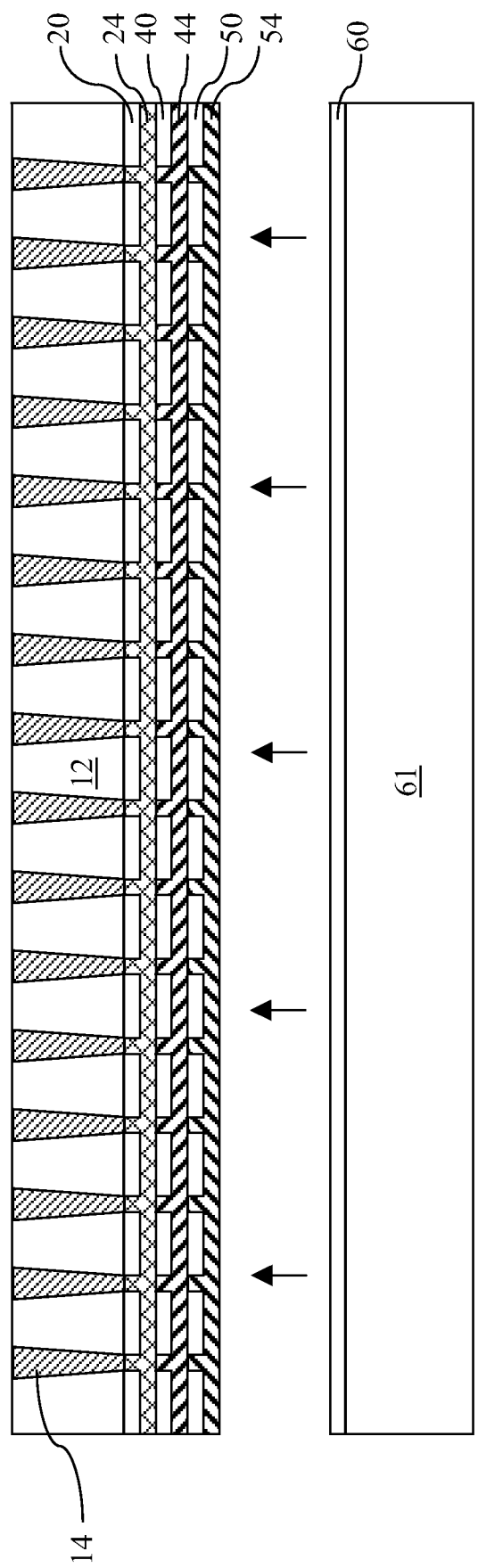
Figure 2U:
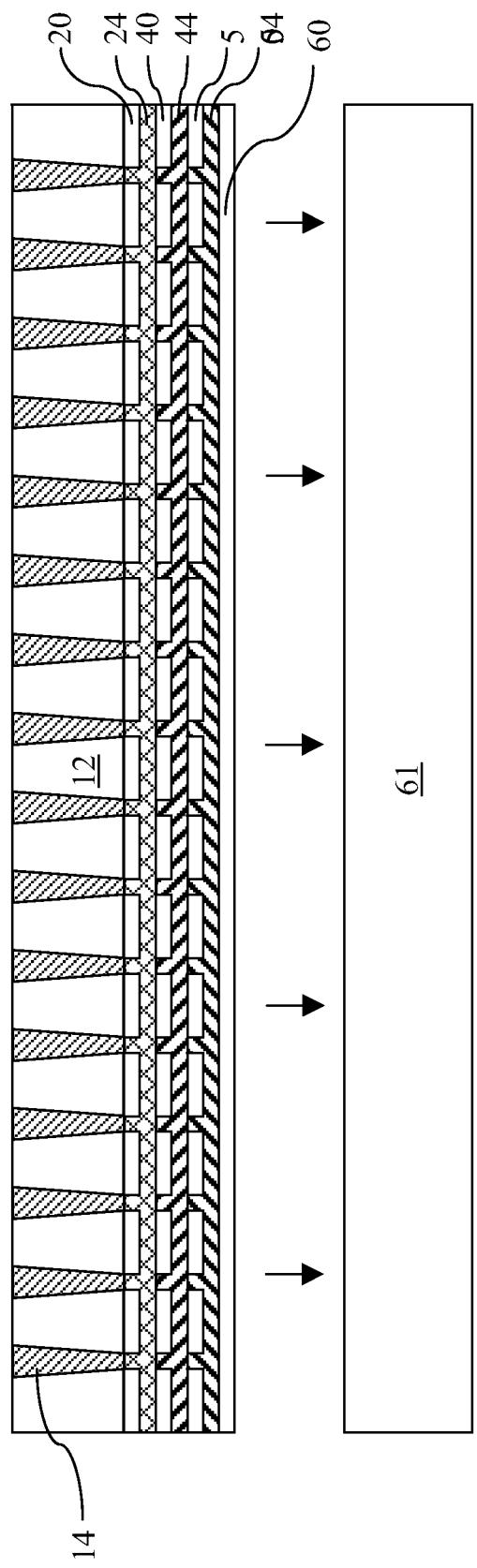
Figure 2V:
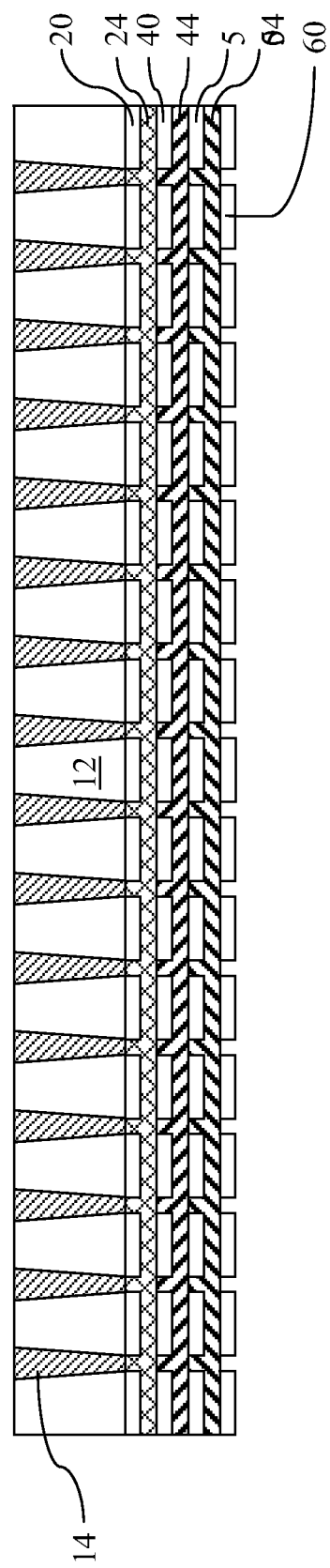
Figure 2W:
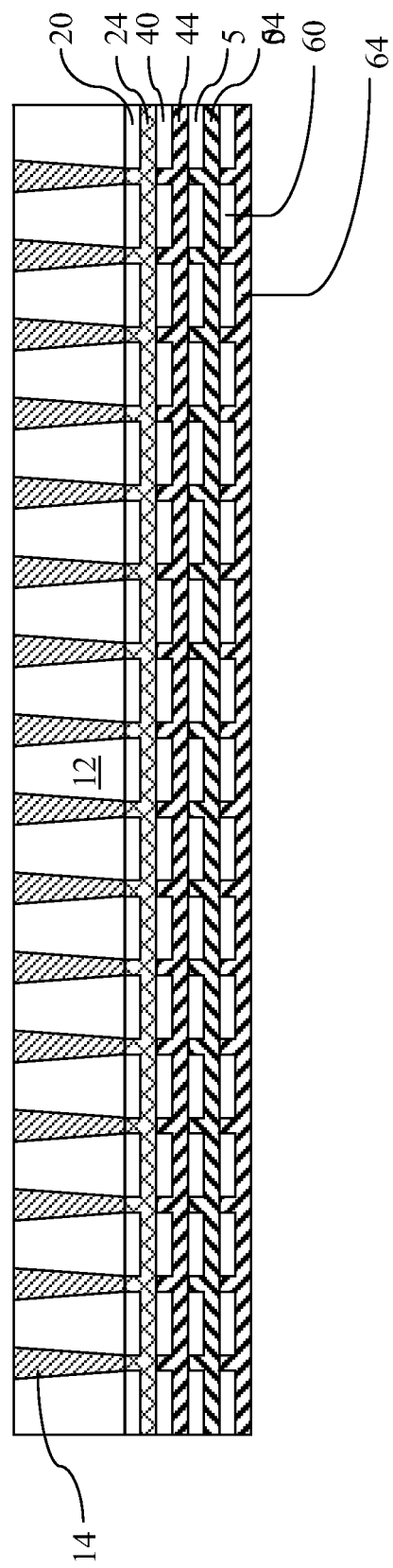

Referring to FIG. 2S, the assembly of the exemplary semiconductor structure containing the PTSS 12, the plurality of the PTSS through vias 14, the PTSL 20, and the PTSIL 24, the first functional layer 40, the first functional interconnect layer 44, the second functional layer 50, and the second functional interconnect layer 54 is loaded onto a substrate test station (not shown) that is connected to a tester (not shown). A third test probe 84 to which a third set of test pins 85 is attached is also loaded into the substrate test station. The third set of test pins 85 contacts the top surfaces of the plurality of the PTSS through vias 14 of the exemplary semiconductor structure. Testing is subsequently performed to ascertain the functionality of the second functional layer 50 within each semiconductor die. Any defective dies are recorded into the test data tracking system so that defective dies may be excluded from future testing and eventually discarded. The third test probe 84 may, or may not, be the same as the first test probe 80 or the second test probe 82.

Referring to FIGS. 2T-2W, a third functional layer 60 and a third functional interconnect layer 64 are formed on the exemplary semiconductor structure employing the processing steps of FIGS. 2O to 2R with the replacement of the second functional layer 50 with the third functional layer 60 and with the replacement of the second functional interconnect layer 54 with the third functional interconnect layer 64. The third functional layer is yet another one of the at least one functional layer described above. A third functional layer carrier 61 is employed to carry the third functional layer 60. After attaching the third functional layer 60 to the exemplary semiconductor structure, the third functional layer carrier 61 is removed.

As many additional functional layers may be formed as need by repetition of the methods shown in FIGS. 2O to 2S.

Figure 2X:
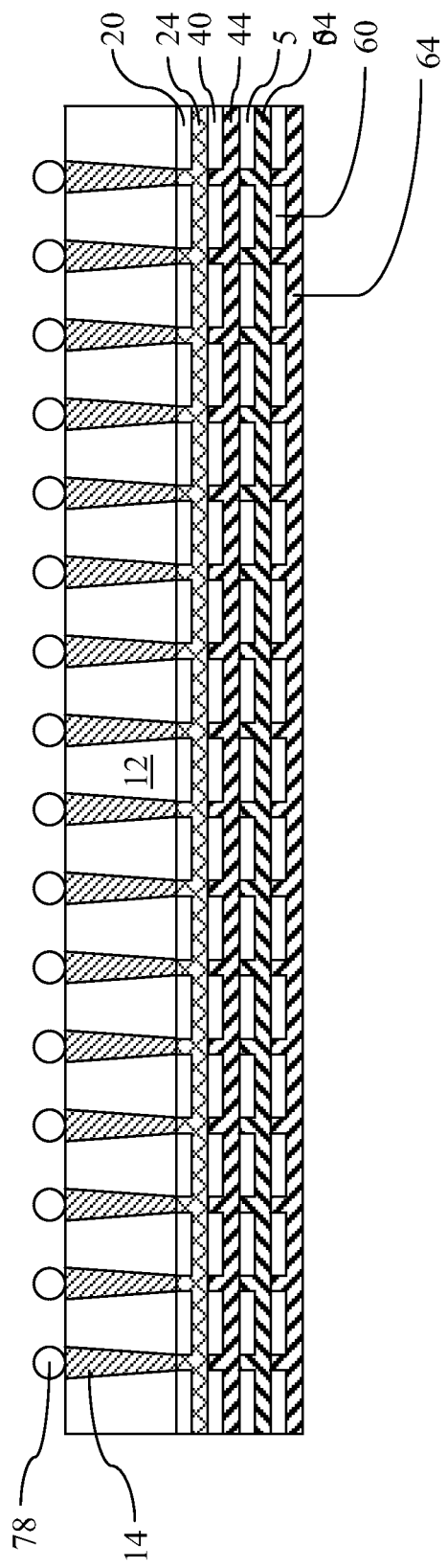

Referring to FIG. 2X, C4 balls 78 are formed on the top surfaces of the plurality of the PTSS through vias 14. Preferably, the C4 balls 78 are formed in the middle of each of the top surfaces of the plurality of the PTSS through vias 14. The C4 balls 78 may have a diameter from about 75 μm to about 100 μm, while lesser and greater diameters also explicitly contemplated herein.

Figure 2Y:
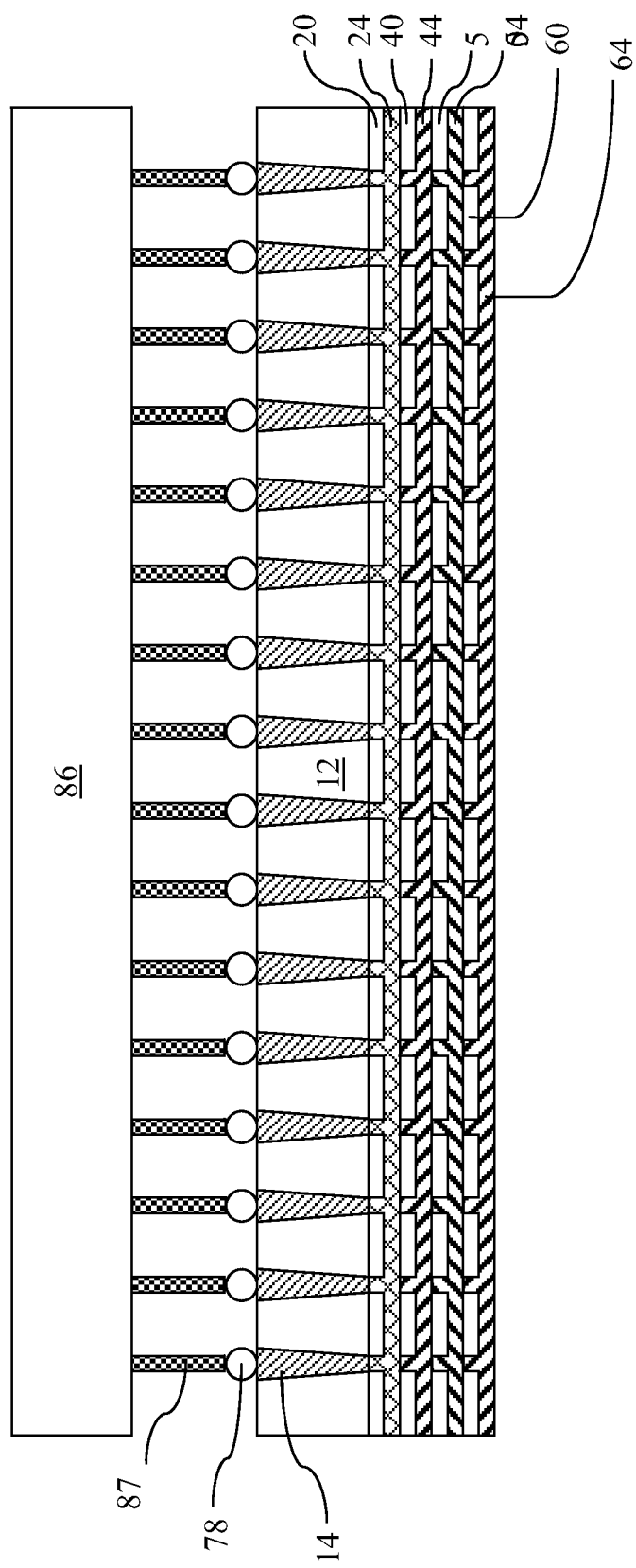

Referring to FIG. 2Y, the exemplary semiconductor structure containing the PTSS 10, the plurality of the PTSS through vias 14, the PTSL 20, the PTSIL 24, the first functional layer 40, the first functional interconnect layer 44, the second functional layer 50, the second functional interconnect layer 54, the third functional layer 60, the third functional interconnect layer 64, and the C4 balls 78 is loaded onto a substrate test station (not shown) that is connected to a tester (not shown). A fourth test probe 86 to which a fourth set of test pins 87 is attached is also loaded into the substrate test station. The fourth set of test pins 87 contacts the C4 balls 78 of the exemplary semiconductor structure. Testing is subsequently performed to ascertain the overall functionality of the assembly of the exemplary semiconductor structure including the PTSL 20, the PTSIL 24, the various functional layers (40, 50, 60), and the various functional interconnect layers (44, 54, 64) within each semiconductor die. Any defective dies are recorded into the test data tracking system so that the defective dies may be discarded.

After the exemplary semiconductor structure, which is a three-dimensional semiconductor structure, is unloaded from the substrate test station, the exemplary semiconductor structure may be packaged by a C4 bonding process in which the C4 balls 78 are bonded to package side C4 pads on a packaging substrate. Alternately, the C4 bonding balls 78 may be altogether skipped in favor of wire bonding, in which case the exemplary semiconductor structure may be packaged by wire bonding methods.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a plurality of conductive through vias located in a substrate;
a peripheral test structure layer in physical contact with a surface of said substrate and containing a plurality of openings therein, and containing peripheral test structures that laterally surround said plurality of openings; and
at least one functional layer including a functional layer, said functional layer overlying, and in physical contact with, said peripheral test structure layer and extending through said plurality of openings and contacting surfaces of said plurality of conductive through vias, and said at least one functional layer containing at least one functional semiconductor circuit, wherein top surfaces of said plurality of said conductive through vias are exposed on an opposite side of said substrate relative to said peripheral test structure layer and provide access points for testing functionality of said peripheral test structures.

2. The semiconductor structure of claim 1, wherein said top surfaces of said plurality of said conductive through vias are coplanar with a top surface of said substrate.

3. The semiconductor structure of claim 1, wherein a set of test pins of a test probe directly contacts said top surfaces of said plurality of said conductive through vias.

4. The semiconductor structure of claim 1, wherein said top surfaces of said plurality of said conductive through vias are electrically disconnected among one another.

5. The semiconductor structure of claim 1, wherein said top surfaces of said plurality of said conductive through vias are arranged in a linear array or in a two-dimensional array.

6. The semiconductor structure of claim 1, further comprising a peripheral test structure interconnect layer vertically abutting said peripheral test structural layer and said plurality of conductive through vias.

7. The semiconductor structure of claim 6, further comprising at least one functional interconnect layer vertically abutting one of said at least one functional layer.

8. The semiconductor substrate of claim 1, wherein an entirety of said top surfaces of said plurality of said conductive through vias and an entirety of a top surface of one of said at least one functional layer are exposed.

9. The semiconductor structure of claim 1, further comprising C4 balls located on said top surfaces of said plurality of said conductive through vias.

10. The semiconductor structure of claim 1, wherein said substrate provides mechanical support to said peripheral test structure layer and said at least one functional layer and renders said semiconductor structure portable without attaching a carrier or another substrate.

11. The semiconductor structure of claim 1, wherein said peripheral test structure layer comprises at least one of a decompression circuit, a compression circuit, a bandwidth change circuit providing signal paths for a circuit in said at least one functional layer, a plurality of vias which allows a reduction of a scan chain length of a circuit in said at least one functional layer to a number less than 100 by allowing more scan chains, a result compression circuit containing capture points for a circuit in said at least one functional layer, a non-volatile random access memory (NVRAM) circuit that provides a capture of system states, a replication operation, or a hibernation operation for a circuit in said at least one functional layer, a power supply that enables powering down of a circuit in said at least one functional layer, a built-in-self-test (BIST) engine for an array macro in said at least one functional layer, a field programmable gate array (FPGA), a supplementary circuit that provides an analog sampling function for an analog circuit in said at least one functional layer, a buffer component that isolates a circuit of the at least one functional layer from an undesirable load during a test, and a power control circuit that performs management of power aspects of a circuit in said at least one functional layer including voltage regulation, current limiting, and temperature monitoring.

12. The semiconductor structure of claim 1, wherein said top surfaces of said plurality of said conductive through vias further provide access points for testing functionality of said at least one functional semiconductor circuit.

13. The semiconductor structure of claim 1, wherein said top surfaces of said plurality of said conductive through vias further provide access points for testing functionality of said at least one functional layer.

14. The semiconductor structure of claim 1, wherein said top surfaces of said plurality of said conductive through vias are not in physical contact with any structure and are exposed to an ambient.

15. The semiconductor structure of claim 1, wherein said top surfaces of said plurality of said conductive through vias are in physical contact with C4 balls.

* * * * *